United States Patent
Brueck et al.

(10) Patent No.: US 10,957,819 B2
(45) Date of Patent: Mar. 23, 2021

(54) GROWTH OF CUBIC CRYSTALLINE PHASE STRUCTURE ON SILICON SUBSTRATES AND DEVICES COMPRISING THE CUBIC CRYSTALLINE PHASE STRUCTURE

(71) Applicant: UNM RAINFOREST INNOVATIONS, Albuquerque, NM (US)

(72) Inventors: Steven R. J. Brueck, Albuquerque, NM (US); Seung-Chang Lee, Albuquerque, NM (US); Christian Wetzel, Troy, NY (US); Mark Durniak, Troy, NY (US)

(73) Assignee: UNM RAINFOREST INNOVATIONS, Albuquerque, NM (US)

( * ) Notice: Subject to any disclaimer, the term of this patent is extended or adjusted under 35 U.S.C. 154(b) by 0 days.

(21) Appl. No.: 16/567,535

(22) Filed: Sep. 11, 2019

(65) Prior Publication Data
US 2020/0006597 A1   Jan. 2, 2020

Related U.S. Application Data

(60) Division of application No. 15/374,547, filed on Dec. 9, 2016, now Pat. No. 10,453,996, which is a
(Continued)

(51) Int. Cl.
*H01L 33/32* (2010.01)
*H01L 21/02* (2006.01)
(Continued)

(52) U.S. Cl.
CPC .......... *H01L 33/32* (2013.01); *H01L 21/0243* (2013.01); *H01L 21/0251* (2013.01);
(Continued)

(58) Field of Classification Search
CPC ............... H01L 33/32; H01L 21/02381; H01L 21/02395; H01L 21/02433;
(Continued)

(56) References Cited

U.S. PATENT DOCUMENTS

| | | |
|---|---|---|
| 4,999,314 A | 3/1991 | Pribat et al. |
| 5,001,080 A | 3/1991 | Wada et al. |

(Continued)

FOREIGN PATENT DOCUMENTS

WO   2013/165620 A1   11/2013

OTHER PUBLICATIONS

International Search Report dated Jul. 23, 2013 from International Application No. PCT/US2013/032613; pp. 1-11.
(Continued)

*Primary Examiner* — Edward Chin
(74) *Attorney, Agent, or Firm* — MH2 Technology Law Group LLP

(57) ABSTRACT

A method of forming a semiconductor structure includes providing a substrate comprising a first material portion and a single crystal silicon layer on the first material portion. The substrate further comprises a major front surface, a major backside surface opposing the major front surface, and a plurality of grooves positioned in the major front surface. A buffer layer is deposited in one or more of the plurality of grooves. A semiconductor material is epitaxially grown over the buffer layer and in the one or more plurality of grooves, the epitaxially grown semiconductor material comprising a hexagonal crystalline phase layer and a cubic crystalline phase structure disposed over the hexagonal crystalline phase.

9 Claims, 28 Drawing Sheets

Related U.S. Application Data continuation-in-part of application No. 14/383,833, filed as application No. PCT/US2013/032613 on Mar. 15, 2013, now Pat. No. 9,520,472.

(60) Provisional application No. 61/642,680, filed on May 4, 2012.

(51) Int. Cl.
   *H01L 21/78*   (2006.01)
   *H01L 33/04*   (2010.01)
   *H01L 33/18*   (2010.01)
   *H01L 29/04*   (2006.01)
   *H01L 33/00*   (2010.01)

(52) U.S. Cl.
   CPC .... *H01L 21/0254* (2013.01); *H01L 21/02381* (2013.01); *H01L 21/02395* (2013.01); *H01L 21/02433* (2013.01); *H01L 21/02458* (2013.01); *H01L 21/02494* (2013.01); *H01L 21/02502* (2013.01); *H01L 21/02587* (2013.01); *H01L 21/02609* (2013.01); *H01L 21/7806* (2013.01); *H01L 29/04* (2013.01); *H01L 33/0075* (2013.01); *H01L 33/0093* (2020.05); *H01L 33/04* (2013.01); *H01L 33/18* (2013.01)

(58) Field of Classification Search
   CPC ........... H01L 21/02458; H01L 21/0251; H01L 21/0254; H01L 21/02587; H01L 21/0243; H01L 21/02609; H01L 21/02502; H01L 21/02494; H01L 21/7806; H01L 33/0079; H01L 33/04; H01L 33/18; H01L 33/0075; H01L 29/04; H01L 33/007; H01L 33/0093

See application file for complete search history.

(56) References Cited

U.S. PATENT DOCUMENTS

| | | | |
|---|---|---|---|
| 6,358,316 B1 | 3/2002 | Kizuki et al. | |
| 6,696,311 B2 | 2/2004 | Macomber et al. | |
| 7,790,045 B1* | 9/2010 | Chuang | B81C 1/00031 216/2 |
| 8,183,134 B2 | 5/2012 | Wu et al. | |
| 8,217,418 B1 | 7/2012 | Pan et al. | |
| 8,222,063 B2* | 7/2012 | Wang | H01L 33/20 438/38 |
| 8,268,648 B2 | 9/2012 | Pan | |
| 8,283,676 B2 | 10/2012 | Pan et al. | |
| 8,304,794 B2 | 11/2012 | Pan | |
| 8,313,967 B1* | 11/2012 | Lee | H01L 29/045 438/44 |
| 8,624,292 B2 | 1/2014 | Pan et al. | |
| 8,674,383 B2 | 3/2014 | Pan | |
| 8,722,441 B2 | 5/2014 | Pan et al. | |
| 9,048,173 B2* | 6/2015 | Bayram | H01L 21/02381 |
| 9,153,431 B1 | 10/2015 | Lee et al. | |
| 9,153,739 B2 | 10/2015 | Huang | |
| 9,461,112 B1 | 10/2016 | Lee et al. | |
| 9,520,472 B2* | 12/2016 | Brueck | H01L 21/0243 |
| 9,752,252 B1* | 9/2017 | Lee | H01L 29/045 |
| 2003/0031219 A1* | 2/2003 | Sawaki | H01S 5/32341 372/45.01 |
| 2006/0169987 A1* | 8/2006 | Miura | H01L 21/0245 257/79 |
| 2010/0027328 A1 | 2/2010 | Czubatyj et al. | |
| 2011/0049568 A1 | 3/2011 | Lochtefeld et al. | |
| 2011/0114917 A1* | 5/2011 | Pan | H01L 33/20 257/13 |
| 2015/0108427 A1 | 4/2015 | Brueck et al. | |
| 2016/0064492 A1 | 3/2016 | Li et al. | |
| 2017/0194476 A1* | 7/2017 | Brueck | H01L 21/02458 |

OTHER PUBLICATIONS

S. C. Lee et al., "Nanoscale Spatial Phase Modulation of GaN on a V-Grooved Si Substrate—Cubic Phase GaN on Si (001) for Monolithic Integration," IEEE Journal of Quantum Electronics, (2005), vol. 41, No. 4, pp. 596-605.

Lee et al., "Phase control of GaN on Si by nanoscale faceting in metalorganic vapor-phase epitaxy," Journal of Crystal Growth, 272 (2004), pp. 2-8.

Lee et al., "Spatial phase separation of GaN selectivity grown on a nanoscale faceted Si surface," Applied Physics Letters, vol. 84, No. 12, (2004), pp. 2079-2081.

Steven RJ Brueck, et al., Growth of Cubic Crystalline Phase Structure on Silicon Substrates and Devices Comprising the Cubic Crystalline Phase Structure, U.S. Appl. No. 15/466,461, filed Mar. 22, 2017, pp. 1-126.

S. C. Lee et al., "Atomic-Scale Phase Transition of Epitaxial GaN on Nanostructured Si(001): Activation and Beyond", Crystal Growth Design, vol. 16, 2016, pp. 2183-2189.

Mark T. Durniak et al., "Green Emitting Cubic GaInN/GaN Quantum Well Stripes on Micropatterned Si(001) and Their Strain Analysis", Advanced Electronic Materials, vol. 2, 2016, pp. 1-8.

Ashwin K. Rishinaramangalam et al., "Semipolar InGaN/GaN nanostructure light-emitting diodes on c-plane sapphire", Applied Physics Express, 9, 032101, (2016), pp. 1-4.

R. Liu et al., "Maximizing cubic phase gallium nitrade surface coverage on nano-patterned silicon (100)", Applied Physics Letters, vol. 109, No. 4, 2016, pp. 1-14.

Wikipedia, "High-electron-mobility transistor", Retrieved from the Internet on Jan. 20, 2017: https://en.wikipedia.org/wiki/High-electron-mobility_transistor, pp. 1-5.

Seung-Chang Lee et al., "Cubic Phase, Nitrogen-Based Compound Semiconductor Films", U.S. Appl. No. 15/272,153, filed Sep. 21, 2016, pp. 1-35.

Christoph J. M. Stark et al., "Green cubic GaInN/GaN light-emitting diode on microstructured silicon (100)", Applied Physics Letters, 103, 232107, (2013), pp. 1-5.

M. Durniak et al., "Growth of Non-Polar Cubic GaN on Common Si", ECS Transactions, vol. 66, No. 7, 2015, pp. 41-44.

S. C. Lee et al., "Incorporation of indium on cubic GaN epitaxially induced on a nanofaceted Si(001) substrate by phase transition", Applied Physics Letters, 107, 231905 (2015), pp. 1-6.

Christoph J. M. Stark et al., "Cubic GaInN/GaN Multi-Quantum Wells for Increased Smart Lighting System Efficiency", CLEO Technical Digest, OSA, 2012, pp. 1-2.

Mark Durniak et al., "Going Green with cubic GaN", Technology LEDs, Retrieved from the Internet: www.compoundsemiconductors.net, Jan. / Feb. 2014, pp. 1-4.

Final Office Action in corresponding U.S. Appl. No. 16/191,197 dated Oct. 10, 2019, 7 pages.

Notice of Allowance in U.S. Appl. No. 16/191,197 dated Jan. 2, 2020, 9 pages.

Barski et al.,"Epitaxial growth of cubic GaN and AlN on Si(001)", MRS Internet Journal of Nitride Semiconductor Research, vol. 1, No. 21, 1996, 5 pages.

Yang et al., "Growth of cubic GaN on Si(001) by plasma-assisted MBE", Applied Surface Science, vol. 123/124, 1998, 7 pages.

As et al., "Cubic GaN epilayers grown by molecular beam epitaxy on thin β-SiC/Si (001) substrates", Applied Physics Letters, vol. 76, Mar. 20, 2000, 4 pages.

Romanyuk et aL, "Atomic and electronic structure of GaP/Si(111), GaP/Si(110), and GaP/Si(113) interfaces and superlattices studied by density functional theory", Physical Review B, vol. 88, No. 115312, 2013, 8 pages.

Narayanan et al., "Orientation mediated self-assembled gallium phosphide islands grown on silicon", Philosophical Magazine A, vol. 82, No. 4, 2002, 19 pages.

(56) References Cited

OTHER PUBLICATIONS

Gao et al., "Effect of InGaAs interlayer on the properties of GaAs grown on Si (111) substrate by molecular beam epitaxy", Journal of Applied Physics, vol. 116, 2014, 10 pages.
Xu et al., "Effects of annealing and substrate orientation on epitaxial growth of GaAs on Si", Journal of Applied Physics, vol. 106, 2009, 5 pages.
Feng et al., "Optical and structural properties of GaN materials and structures grown on Si by metalorganic chemical vapor deposition", Thin Solid Films, vol. 409, 2002, 8 pages.
Lee et al., "Spatial phase separation of GaN selectively grown on a nanoscale faceted Si surface", Applied Physics Letters, vol. 84, No. 12, Mar. 22, 2004, 3 pages.
Lee et al., "Phase control of GaN on Si by nanoscale faceting in metalorganic vapor-phase epitaxy", Journal of Crystal Growth, vol. 272, 2004, 7 pages.
Narayanan t al., "Stacking faults and twins in gallium phosphide layers grown on silicon", Philosophical Magazine A, vol. 82, No. 4, 2002, 15 pages.
Sukidi et al., "Initial Stages of Heteroepitaxy of GaP on Selected Silicon Surfaces", Journal of the Electrochemical Society, vol. 146, No. 3, 1999, 5 pages.

\* cited by examiner

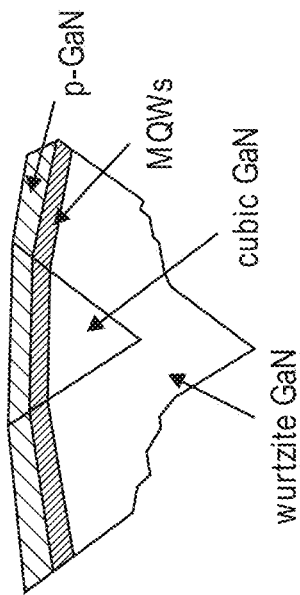
FIG. 15A
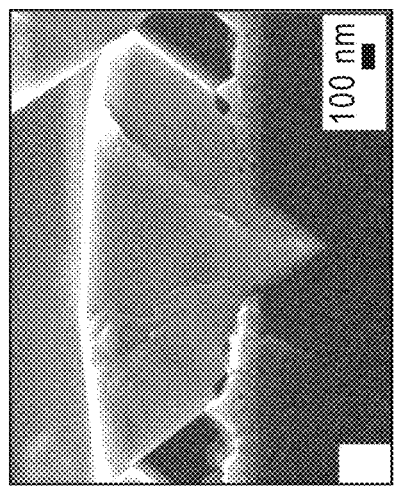
FIG. 15B
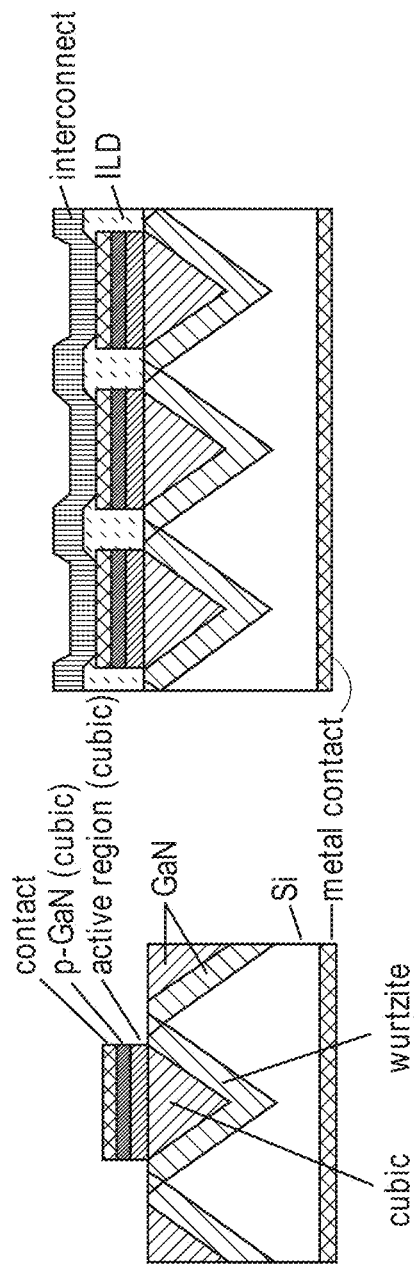
FIG. 16A
FIG. 16B

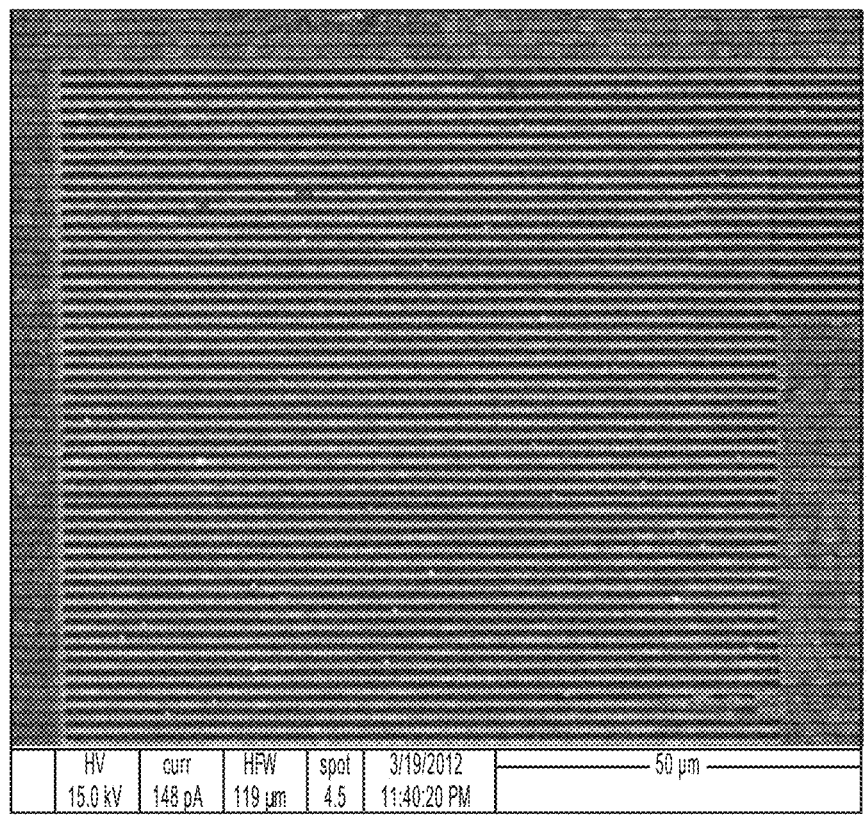
FIG. 22
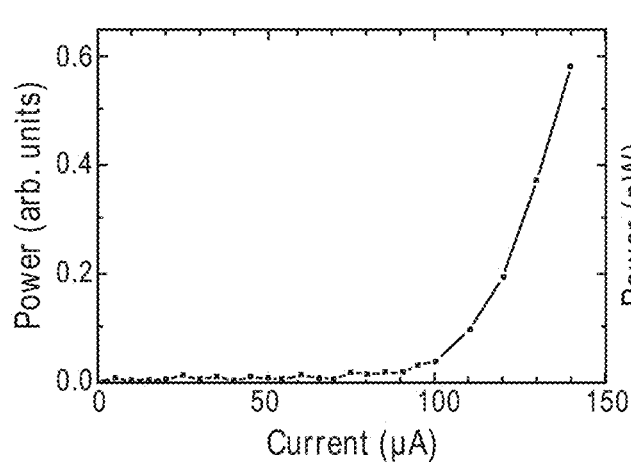
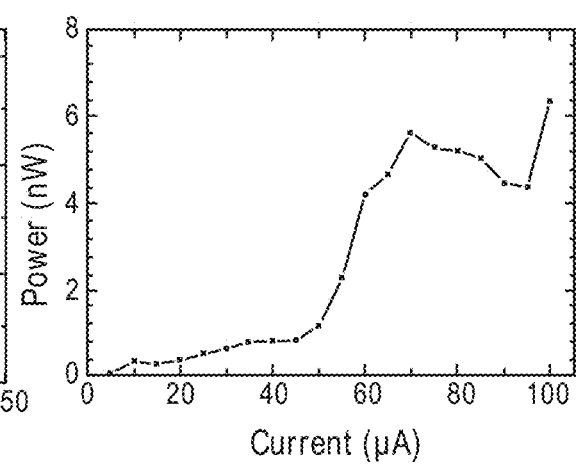
FIG. 23A       FIG. 23B

Cross sectional view of cubic III-nitride photodetector

GROWTH OF CUBIC CRYSTALLINE PHASE STRUCTURE ON SILICON SUBSTRATES AND DEVICES COMPRISING THE CUBIC CRYSTALLINE PHASE STRUCTURE

DESCRIPTION OF THE DISCLOSURE

Cross Reference to Related Disclosures

The present application is a divisional application of U.S. patent application Ser. No. 15/374,547, filed on Dec. 9, 2016, which is a continuation-in-part of U.S. patent application Ser. No. 14/383,833, filed on Sep. 8, 2014, now U.S. Pat. No. 9,520,472, which is a 371 national stage application of PCT/US2013/032613, filed Mar. 15, 2013, which claims benefit under 35 U.S.C. § 119(e) from U.S. Provisional Application No. 61/642,680 filed on May 4, 2012, the disclosures of all of which applications are herein incorporated by reference in their entireties.

GOVERNMENT INTEREST

This invention was made with U.S. Government support under Grant No. EEC-0812056 from the National Science Foundation. The U.S. Government has certain rights in the invention.

FIELD OF THE DISCLOSURE

The present application is directed to a method of growing cubic crystalline phase structure and devices made therefrom.

BACKGROUND OF THE DISCLOSURE

III-N semiconductors are promising optoelectronic materials whose direct bandgap optical emission spans the ultraviolet to infrared. Despite the impressive progress of visible light-emitting diodes (LEDs) in the nitride material system over the past two decades, two major issues are widely recognized: 1) the green gap, and 2) efficiency droop. The green gap refers to the fact that today's InGaN LEDs emitting in the green have lower efficiencies than comparable devices in the blue, or to red LEDs in the AlInGaP material system. This is an issue since the sensitivity of the human eye peaks in the green. Efficiency droop is the reduction in efficiency at high drive levels, suitable for illumination. The exact origins of these effects are not fully understood, but often the polarization fields in the InGaN wurtzite material system are thought to be a root cause.

GaN and alloys including AlGaN and InGaN (or GaInN) exhibit both hexagonal (wurtzite) and cubic (e.g., zinc-blende) phases. As used herein, the terms AlGaN, InGaN and GaInN are shorthand notations common in the field for $Al_xGa_{1-x}N$, $In_yGa_{1-y}N$ and $Ga_{1-y}In_yN$. For GaN and InGaN the hexagonal (h-GaN) phase is energetically preferred and with a few exceptions, all device applications including high-power transistors, light-emitting diodes (LEDs) and laser diodes have been developed with h-GaN material.

There are potential advantages to cubic (c-GaN) material and its alloys. One advantage is that the (001) direction (i.e., the direction of growth on the (001) crystal face) is not only free of spontaneous polarization, but also free of piezo-electric polarization. The bandgap of the cubic nitrides is slightly smaller than that of the wurtzite polytypes, and therefore the band-edge emission in bulk crystals of cubic GaInN has longer wavelength than in wurtzite crystals with the same indium concentration. The general absence of internal electric fields in c-GaN LEDs can eliminate the redshift associated with the quantum-confined Stark effect (QCSE).

Another potential benefit of cubic GaN is the high hole mobility, which is reported to reach 350 $cm^2V^{-1}s^{-1}$ in cubic GaN on GaAs. A practical advantage of (001) c-GaN is that it can be cleaved along the {110} planes, which are perpendicular to the (100) growth direction. This could be a major advantage for device fabrication, e.g. the fabrication of laser diode devices. Further, based on theoretical calculations, it has been suggested that the Auger-recombination in the blue-green region could be smaller in c-GaInN structures than in their wurtzite counter-part. This could impact the efficiency droop effects.

According to the literature, c-GaN has been successfully grown by plasma assisted molecular beam epitaxy (MBE) or metal organic vapor phase epitaxy (MOVPE) on different substrates, including 3C—SiC, 6H—SiC (as super lattice), GaAs, and Si (001). Also, growth of nano-wires with cubic GaN has been demonstrated by MBE. In the case of growth on GaAs, large free-standing samples with 100 μm thickness have been achieved. Novikov et al., "Molecular beam epitaxy as a method for the growth of freestanding zinc-blende (cubic) GaN layers and substrates," *J. Vac. Sci. Technol. B* 28, vol. 28, no. 3, pp. C3B1-C3B6, October 2010. However, it took those authors around 8 days to grow such material. It remains difficult to keep optimal growth conditions for such long durations, and the best material quality was believed to have been achieved only within the first 10 μm starting from the substrate. This thickness however would be sufficient for use in LEDs.

Novikov also recently demonstrated the feasibility of growing freestanding cubic GaN with a thickness of more than 50 μm on a GaAs substrate of 7.62 cm (3 inch) diameter. "Zinc-blend (cubic) GaN bulk crystals grown by molecular beam epitaxy," *Phys. Stat. Sol. (c)*, vol. 8, no. 5, pp. 1439-1444, May 2011. Novikov also demonstrated cubic $Al_xGa_{1-x}N$ layers in a very wide range of alloy compositions. While these are impressive results, it is generally agreed that such long growths are not compatible with cost-effective manufacturing of LEDs in high volume.

Structures with cubic GaInN/GaN multi-quantum wells (MQW) have been reported on 3C SiC, where PL emission was observed up to a wavelength of 520 nm. Simple p-GaN/n-GaN junction LEDs have been reported on GaAs. The electroluminescence (EL) emission at 430 nm was attributed to originate from impurity-related recombination and its intensity showed a linear dependence on the drive current density in the range of 50-300 $A/cm^2$. A p-GaN/i-GaN/n-AlGaN junction LED (emission at 477 nm) as well as a double heterojunction LED with GaInN active layer grown on GaAs (emission at 430 nm and 470 nm) have been demonstrated. It can be inferred from the published EL spectra of these devices that the intensity depends linearly on the drive current. However, the total light output power from these devices is not known.

Recently, a GaInN/GaN LED grown by ammonia-MBE has been demonstrated. It was grown on freestanding cubic GaN templates by MBE on GaAs and showed EL around 460 nm. There is also published work on short wavelength devices. Near UV emission at 370 nm in photoluminescence (PL) from cubic AlGaN/GaN multi-quantum wells with varying width can be modeled using square-well potentials, which was interpreted as absence of polarization fields along the (001) direction.

It is fair to say that the above described techniques for growing c-group-III-N compounds have involved isolated efforts that have not been suitable and accepted for device fabrication. Many of the results showed significant levels of defects including uncontrolled spatial variations between c-GaN and h-GaN materials. The h-GaN material remains the better material, the most explored for device applications, and the only phase used for today's commercial devices.

The epitaxial growth of high quality, c-group-III-N compounds at a physical scale applicable to practical device fabrication is also not well established. This is at least partially due to various problems such as uncontrolled phase mixtures with the hexagonal phase and some issues on the selection of substrates for epitaxy related to the mismatch in crystal symmetry and lattice constant. Generally, sapphire and SiC have been employed as substrate materials but these are incompatible with the mainstream semiconductor technology that exclusively uses Si(001) substrates. In spite of its predominant use for microelectronics, Si has not been extensively investigated as a substrate for c-group-III-Ni-trides because of these growth problems, and, for optical applications, because of the intrinsic light absorption in any remaining Si after the growth.

An emerging theme in modern crystal growth is the integration of the exquisitely controlled growth capabilities of MBE and MOVPE with developing large-area nanoscale lithography capabilities. The useful length scale for the lithography is less than or comparable to an adatom diffusion length during growth. Recently, relying on large-area nanoscale interferometric lithography, certain inventors of this disclosure demonstrated the growth of c-GaN with a controllable, symmetry-induced phase separation from the hexagonal phase during growth on a deep sub-micron scale Si(111)-faceted v-groove fabricated into a Si(001) substrate. S. C. Lee, et al., *Appl. Phys. Lett.* 84 (2004) 2079. This proves the availability of the epitaxial growth of c-group-III-N materials on a Si(001) substrate at the nanoscale regime and is directly compatible with current Si microelectronics technology.

Further advancements in growth of c-group-III-N materials that overcome one or more of the deficiencies of current growth techniques, such as those mentioned above, would be a desirable addition to the field of III-N semiconductors.

SUMMARY OF THE DISCLOSURE

An embodiment of the present disclosure is directed to a semiconductor device. The semiconductor device includes a substrate comprising a groove. A buffer layer is formed on a surface of the groove. The buffer layer comprising at least one material chosen from AlN, GaN or $Al_xGa_{1-x}N$, where x is between 0 and 1. An epitaxially grown semiconductor material is disposed over the buffer layer, at least a portion of the epitaxially grown semiconductor material having a cubic crystalline phase structure.

Another embodiment of the present disclosure is directed to a method of forming a semiconductor device. The method comprises providing a planar crystalline substrate comprising a groove exposing different crystal faces than the planar surface. A buffer layer is deposited over the substrate. The buffer layer comprises at least one material chosen from AlN, GaN or $Al_xGa_{1-x}N$, where x is between 0 and 1. A semiconductor layer is epitaxially grown over the buffer layer, at least a portion of the epitaxially grown semiconductor layer having a cubic crystalline phase structure.

Yet another embodiment of the present disclosure is directed to a method of forming a semiconductor structure. The method comprises providing a substrate comprising a first material portion and a single crystal silicon layer on the first material portion. The substrate further comprises a major front surface, a major backside surface opposing the major front surface, and a plurality of grooves positioned in the major front surface. A buffer layer is deposited in one or more of the plurality of grooves. A semiconductor material is epitaxially grown over the buffer layer and in the one or more plurality of grooves, the epitaxially grown semiconductor material comprising a hexagonal crystalline phase layer and a cubic crystalline phase structure disposed over the hexagonal crystalline phase.

Still another embodiment of the present disclosure is directed to a light emitting diode. The light emitting diode comprises a substrate comprising a Group III/V compound semiconductor material having a cubic crystalline phase, an active region being positioned in the cubic crystalline phase. A first metal contact and a second metal contact are positioned to provide electrical connectivity to the light emitting diode, at least one of the first and second metal contacts being transparent to visible light. After fabrication, the light emitting diode is not attached to a substrate comprising a Group IV semiconductor material.

Another embodiment of the present disclosure is directed to an intermediate semiconductor structure. The intermediate semiconductor structure comprises a substrate comprising a first material portion and a single crystal silicon layer positioned on the first material portion. The substrate further comprises a major front surface, a major backside surface opposing the major front surface, and a groove positioned in the major front surface. A buffer layer is disposed in the groove. An epitaxially grown semiconductor material is disposed over the buffer layer and in the groove. The epitaxially grown semiconductor material comprises a hexagonal crystalline phase layer and a cubic crystalline phase structure disposed over the hexagonal crystalline phase layer.

Additional embodiments and advantages of the disclosure will be set forth in part in the description which follows, and can be learned by practice of the disclosure. The embodiments and advantages of the disclosure will be realized and attained by means of the elements and combinations particularly pointed out in the appended claims.

It is to be understood that both the foregoing general description and the following detailed description are exemplary and explanatory only and are not restrictive of the disclosure, as claimed.

The accompanying drawings, which are incorporated in and constitute a part of this specification, illustrate several embodiments of the disclosure and, together with the description, serve to explain the principles of the disclosure.

BRIEF DESCRIPTION OF THE DRAWINGS

FIG. 1A shows a schematic cross-sectional view of a partially made device being made by the process illustrated by FIGS. 1A to 1C. FIG. 1B shows a schematic cross-sectional view of a partially made device being made by the process illustrated by FIGS. 1A to 1C. FIG. 1C shows a schematic cross-sectional view of a partially made device being made by the process illustrated by FIGS. 1A to 1C.

FIG. 5A shows a cross-section of the thicker buffer layer in wide grooves. FIG. 5B shows fully merged sidewalls in a V-shaped groove.

FIG. 9A shows an array of v-grooves fabricated into a Si(001) substrate.

FIG. 9B is an SEM image of the cross section of the epitaxial layers grown on the grooves in FIG. 9A with a planar top surface. FIG. 9C reveals the surface morphology in top-down view that is slightly roughened by surface undulation along and some bumps near the edges of each stripe.

FIG. 15A shows an SEM cross-section of an example LED structure.

FIG. 15B shows a schematic drawing of the LED structure of FIG. 15A.

FIG. 16A illustrates a schematic cross-section of an LED with a cubic GaN active region, according to an embodiment of the present disclosure.

FIG. 16B illustrates an assembly of the multiple stripes of FIG. 16B into a large area LED using an interconnect layer, according to an embodiment of the present disclosure.

FIG. 22 shows a region where focused ion-beam milling had been used to remove the h-GaN regions from InGaN quantum well structures, according to an example of the present disclosure.

FIG. 23A shows a graph of data collected from examples of the present disclosure.

FIG. 23B shows a graph of data collected from examples of the present disclosure.

DESCRIPTION OF THE EMBODIMENTS

Reference will now be made in detail to various exemplary embodiments of the present application, examples of which are illustrated in the accompanying drawings. Wherever possible, the same reference numbers will be used throughout the drawings to refer to the same or like parts.

Figure 1A:
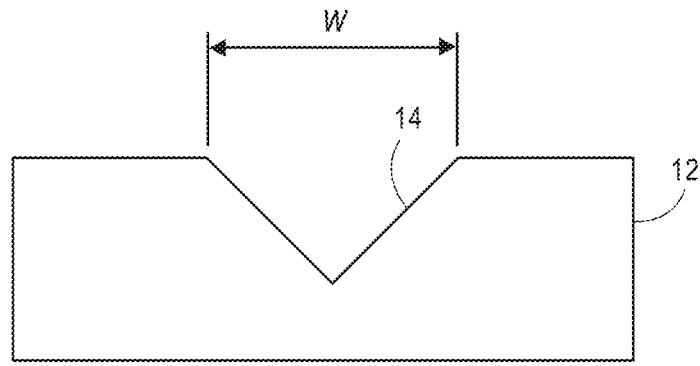
FIGS. 1A to 1C illustrate a method of epitaxially growing a cubic lattice semiconductor and a resulting device structure formed using the method, according to an embodiment of the present disclosure.
Figure 1B:
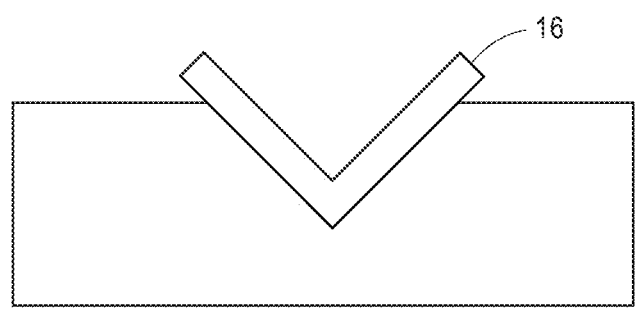
Figure 1C:
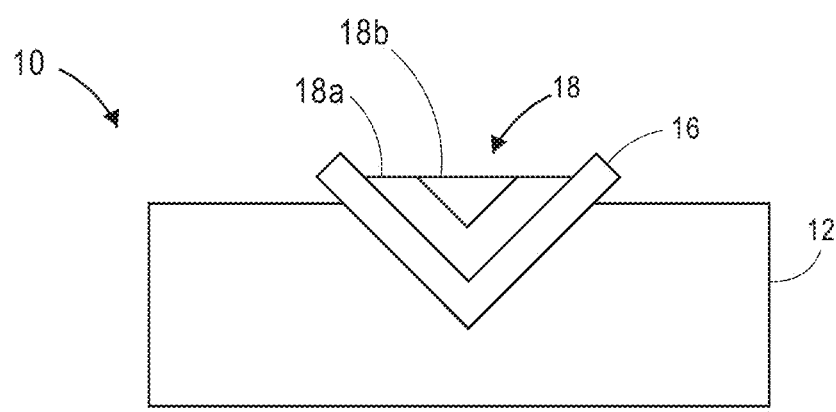

An embodiment of the present disclosure is directed to a semiconductor device 10, as illustrated in FIG. 1C. The device comprises a substrate 12. The substrate comprises a groove 14 formed in crystalline semiconductor. The sidewalls of the groove are (111) faces of the crystalline semiconductor. A buffer layer 16 is formed in the groove 14. The buffer layer 16 comprises at least one material chosen from AlN, GaN or $Al_xGa_{1-x}N$, where x is between 0 and 1. An epitaxially grown semiconductor layer 18 is disposed over the buffer layer 16. A portion of the epitaxially grown layer 18 has a cubic crystalline phase structure 18b.

Substrate

Referring to FIG. 1A, the substrate 12 employed for manufacturing the devices of the present disclosure can be any type of substrate comprising single crystal silicon having a (100) lattice structure. For example, the substrate 12 can be a free-standing silicon wafer, such as those cut from a single crystal boule, as is well known in the art. Alternatively, the substrate can comprise other materials on which the single crystal silicon material is a portion thereof, such as, for example, a silicon-on-glass substrate or a silicon epitaxial layer grown on, or bonded to, a base substrate, referred to as silicon-on-insulator. The silicon can be doped or undoped. In yet another embodiment, a substrate comprising GaAs having a (100) lattice structure can be employed.

The substrate 12 comprises at least one groove 14. The groove can be any shape that provides (111)-faceted groove surfaces that are suitable for epitaxial crystal growth of the buffer layer 16. For example, a v-groove or a flat-bottomed groove can be formed in a silicon or GaAs substrate to provide (111)-faceted sidewalls.

Referring to FIG. 1A, the width of the groove, W, can range from a few nanometers to any width that will allow formation of the cubic lattice region. In an embodiment, W is comparable to a diffusion length of a Ga adatom under the epitaxial growth conditions, which is generally several microns, or less. In an embodiment, the width can be about 3, 5, 8 or 10 microns or less. For example, W can range from about 100 nm to about 5000 nm, or about 200 nm to about 500 nm. These ranges for W can apply to any of the grooves in any of the embodiments for forming cubic crystalline material described herein.

The length of the groove can be any desired length, limited only by the size of the available wafer. For example, the length of groove 14 can be comparable to the width of groove 14 or longer, such as a length ranging from about 10 or 100 times longer to about 1,000,000 times longer than the width of groove 14.

The groove can be formed by any suitable method that provides the desired (111)-faceted surfaces. Examples of suitable methods include lithographic patterning and etching techniques, such as interferometric lithography followed by an anisotropic wet etch of the patterned surface using, for example, KOH or related wet-etch chemistries, including solvent-based chemistries. A variety of other lithographic and etching techniques can be employed, as would be understood by one of ordinary skill in the art.

Buffer Layer

Referring to FIG. 1B, buffer layer 16 can be epitaxially grown in groove 14. In an embodiment, the buffer layer comprises an AlN nucleation layer. An $Al_xGa_{1-x}N$ interlayer can be deposited on the nucleation layer, where x can range from 0 to 1 (thereby encompassing AlN and GaN), for the purpose of growing cubic III-nitrides on silicon wafers. In an embodiment, x is greater than 0 and less than 1.

Figure 24:
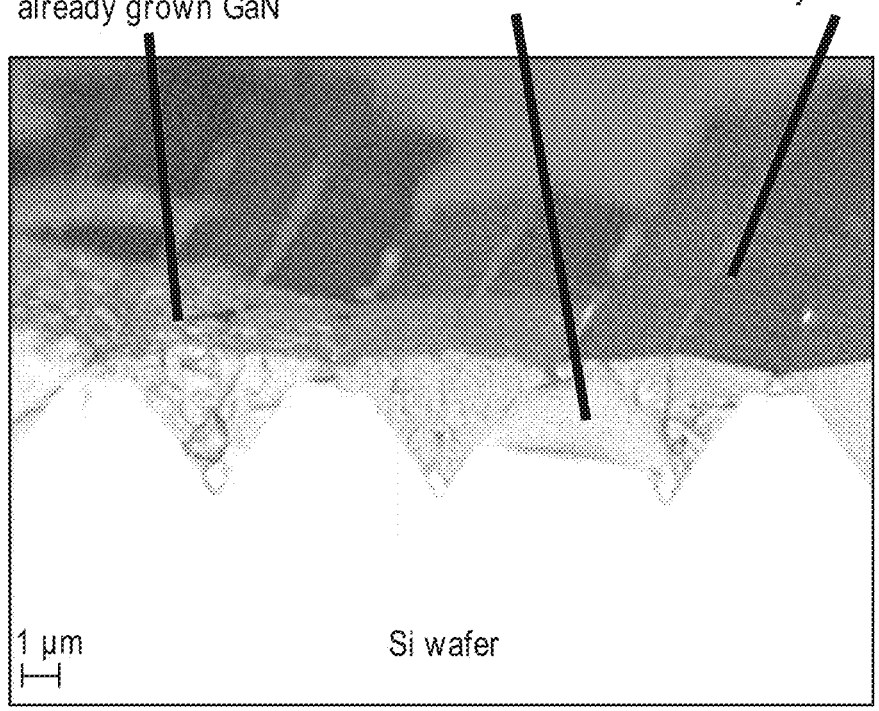
FIG. 24 shows an example of a Ga—Si alloying problem that can be reduced by employing a buffer layer.

Buffer layer 16 plays a part in the overall success of the growth process. Buffer layer 16 can serve as a strain relief layer to increase the crystal quality of the grown cubic III-nitride material. Additionally, buffer layer 16 can reduce or prevent alloying of the subsequently formed crystal layer 18 with material from the substrate. For example, Ga—Si alloying has been shown to occur during epitaxial growth of GaN on silicon substrates. An example of the alloying problem is shown in FIG. 24.

The buffer layer 16 can be sufficiently thick to prevent such alloying, which can be problematic. On the other hand, if buffer layer 16 is too thick, cracking of the buffer layer is likely. In an embodiment, the thickness of the buffer layer can be in the range for example, from sub-monolayer up to about 1 μm, such as about 1 nm to about 1 micron, or about 5 nm or 10 nm to about 100 nm or 500 nm.

In an embodiment, the concentration of Al and Ga in the buffer layer 16 is graded through at least a portion of the thickness of the buffer layer. In an alternative embodiment, the concentration of Al and Ga in buffer layer 16 is substantially constant through the thickness of buffer layer 16.

In an embodiment, the concentration of Al and Ga in the buffer layer 16 and its thickness are varied separately or in combination along at least a portion of its cross section. In an alternative embodiment, the concentration of Al and Ga in buffer layer 16 and its thickness are substantially constant separately or in combination through its cross section. In an embodiment, the composition of the buffer layer (e.g., concentration of Al and Ga) can vary with the different crystal planes it covers. For example, the composition may be different on the bottom portion 106c of groove 106 (FIG. 29A) than on the sidewalls 106a or 106b.

In yet another embodiment, the concentration of Al and Ga varies in a stepwise manner though at least a portion of the thickness of buffer layer 16. For example, buffer layer 16 can comprise two or more layers with one or more different $Al_xGa_{1-x}N$ compositions having stepped concentrations. The concentration can be stepped in any desired manner. As an example, in one layered portion of the buffer layer x can be about 0.7, and in a second layered portion of the buffer layer x can be about 0.3. Another embodiment can use one or more graded buffer layers, where x varies continuously from, for example, about 1 to 0, through the thickness of the layer. The buffer layer may or may not include a nucleation layer, such as AlN, in addition to the $Al_xGa_{1-x}N$ layers. In yet another embodiment, an AlN layer is employed alone, without a Ga containing portion of the buffer layer.

The $Al_xGa_{1-x}N$ buffer layers can be smooth or rough. A relatively smooth buffer layer can have a root-mean-square (RMS) surface roughness value in the range from about 0.1 nm up to and including 1 nm, or more, depending on the crystal plane. In an embodiment for c-plane GaN, the surface roughness value is generally less than 1 nm, such as about 0.2 to about 0.3 nm (RMS); and would be considered relatively rough with a surface roughness value larger than 1 nm (RMS); such as a value ranging from 1.1 nm to about 2 nm or 20 nm (RMS). However, for non-polar and semi-polar GaN (on bulk GaN), a smooth value may range from about 1 nm to about 2 nm (RMS).

Any other suitable buffer layer materials can be employed in the embodiments of the present disclosure in addition to or in place of the above described buffer layer materials. Any suitable epitaxial growth method can be used to form the buffer layer. Suitable examples include MBE and MOVPE. In the case of MOVPE, each MOVPE reactor system is slightly different, and therefore optimal growth conditions on Si (111) faceted sidewalls of a groove can vary. The potential parameter space can be large, because many combinations of temperature, pressure, gas flows, and layer compositions are possible. Selected example growth runs are described herein to provide some guidance in the selection of MOVPE growth conditions.

Epitaxially Grown Layer

In an embodiment, the epitaxially grown layer 18 comprises a cubic III-nitride material. For example, the epitaxially grown layer can comprise c-GaN and/or $c-In_yGa_{1-y}N$, where y is greater than 0 and equal to or less than 1. Other examples of suitable cubic III-nitride materials include GaAsSbN, InAlAsN, InGaAsN, AlGaN, BN, AlGaBN and InAlGaBN. Still other cubic III-V materials could be formed, such as GaAs, AlGaAs or InGaAs. The epitaxially grown layer 18 comprises a second crystalline lattice structure in addition to the cubic lattice structure. In an embodiment, epitaxially grown layer 18 includes both a hexagonal lattice outer region 18a and a cubic lattice inner region 18b.

While the theoretical basis of the formation of the cubic layer is not fully understood, experimental observations provide some suggestions as to the mechanism. What is known about this mechanism will now be described with respect to a GaN (or InGaN) growth on a Si (001) substrate, although a similar mechanism may apply to other III-N materials grown on (001) substrates. The initial phases of GaN (or InGaN) growth are h-GaN (or h-InGaN) that nucleates on the three-fold symmetric Si {111} faces. As noted above, h-GaN (or h-InGaN) is the lower energy phase and forms preferentially over c-GaN (or c-InGaN). As this growth proceeds on the {111} sidewalls of the v-groove, opposing c-axes are formed perpendicular to the {111} sidewalls on which they have nucleated, such that the c-axes of the adjacent crystals lie in the Si {110} plane and are at an angle of about 105° to about 115°, or about 109.5° to one another. The c-axis is the direction of the h-GaN (or h-InGaN) with a larger lattice constant than the other two orthogonal crystal directions, e.g. the h-GaN (or h-InGaN) lattice is elongated along the c-axis direction. As the growth proceeds, these two h-GaN regions merge near the apex of the groove. The crystal structure cannot support the two c-axis directions and the symmetric growth fronts therefore provide a driving force for a phase segregation leading to the formation of the c-GaN (or c-InGaN) material in or near the center of the v-groove where the growth regimes overlap. This is different than growing GaN on planar Si(001) or a shaped surface that does not provide the desired driving force, in which you get a random phase separation that is not useful for the purpose envisioned here. It should be noted that while the symmetry of the epitaxial layer is the same as that of the Si substrate, the lattice constant of the c-GaN (or c-InGaN) is fully relaxed and is not constrained by the underlying Si lattice constant.

Figure 8A:
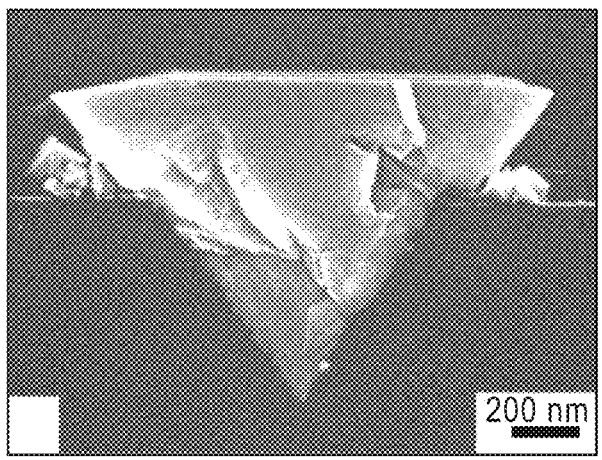
FIG. 8A shows the cross-section of an exemplary individual GaN stripe (with enhanced contrast for clarity).
Figure 8B:
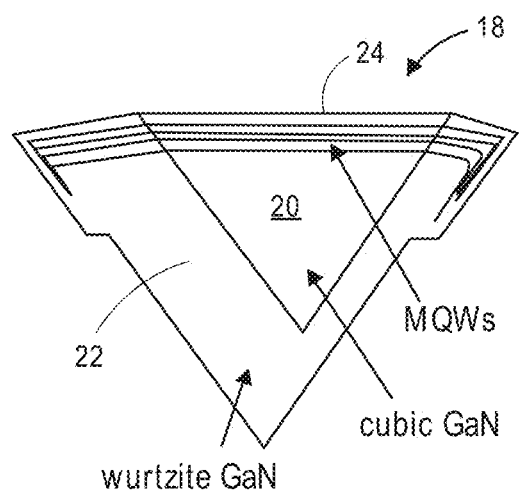
FIG. 8B illustrates an epitaxially grown multiple quantum well (MQW) structure, according to an embodiment of the present disclosure.

FIG. 8B illustrates an epitaxially grown MQW structure formed in an epitaxially grown layer 18, according to an embodiment of the present disclosure. As seen from FIG. 8B, the epitaxially grown layer includes an inner region 20 of c-GaN and an outer region 22 of h-GaN. Region 24 of FIG. 8B illustrates alternating layers of thicker GaN and thinner $In_yGa_{1-y}N$ that form quantum wells. Employing alternating layers to form quantum wells is generally well known in the art. As illustrated, these alternating layers are formed in both the cubic inner region 20 and the hexagonal outer region 22.

Referring again to FIG. 1, epitaxial layer 18 can be grown by any suitable method, such as MBE or MOVPE. The selected method can be the same as or different than the epitaxial method used to grow the buffer layer 16. Any suitable source materials can be employed. For example, in the case of forming $In_yGa_{1-y}N$, any suitable gallium, nitrogen and indium source materials can be employed. Suitable source materials for use in MBE and MOVPE are well known in the art. One caveat is that Al containing materials are generally highly reactive with atmospheric oxygen. Suitable encapsulation and in-situ etching techniques can be used to protect and/or remove native and other oxides if the Al-containing layer is to be exposed to air during transfer between growth modalities or on other occasions. Determining suitable encapsulation and/or in-situ etching techniques is within the capabilities of a person of ordinary skill in the art.

The epitaxially grown layer can have any desired thickness. For example, the epitaxially grown layer 18 can have a thickness ranging from a sub-monolayer to about 10 μm. The length and width dimensions of the epitaxially grown layer 18 can largely be determined by the structuring of the substrate (e.g., the length and width of the groove 14). The length of layer 18 may range from, for example, about 10 or 100 times longer to about 1,000,000 times longer than the width of groove 14. Such structures can be referred to as nanowires or quantum wires.

In an embodiment, a plurality of the epitaxially grown cubic layers can simultaneously be grown in a plurality of adjacent grooves. Each of the plurality of epitaxial layers can comprise both hexagonal and cubic phase lattice structures, such as c-GaN/c-$In_yGa_{1-y}N$ regions and h-GaN/h-$In_yGa_{1-y}N$ regions. The resulting epitaxially grown layers may or may not comprise a plurality of separated MQW cubic regions.

In an embodiment, an optional planarization step may be included after the epitaxial growth of any of the identified layers or the entire structure. In this way, the application of a subsequent epitaxial growth step or the application of a subsequent processing step may be supported or may achieve a higher overall process yield. The planarization can be performed by any suitable method, examples of which are well known in the art.

In an embodiment, the separate cubic regions can subsequently be electrically connected in parallel, series or any combination thereof. For many applications, both in electronics and in optics, it is advantageous to connect a number of adjacent nanowires in parallel to provide a higher current carrying capability than is available with a single nanowire. In some electronics applications it may be desirable to provide an alternate electrical configuration, as is common in modern integrated circuits.

In some instances, it may be desired to reduce or prevent growth of the hexagonal crystal phase while allowing the cubic lattice to continue growing. In an embodiment, a blocking layer can be formed to reduce or prevent growth of the hexagonal phase portion of the epitaxial layer 18. For example, a c-GaN region and an h-GaN region can be separated by a blocking layer. An example of a technique employing a blocking layer is discussed below in the description of FIG. 17.

Devices

The cubic phase epitaxial layers of the present disclosure can be employed in a variety of semiconductor devices. Examples of such devices include light emitting diodes (LEDs), laser diodes, photodetectors and transistors.

In an embodiment, a semiconductor device comprises strips of the epitaxially grown layers and silicon regions. Electronic devices can be positioned in both the epitaxially grown layer and the silicon regions.

In an embodiment, forming the devices of the present disclosure can involve removing at least a portion of the substrate 12. Example techniques for removing the substrate are described in more detail below. In an embodiment, forming the devices described herein can involve completely or partially removing h-GaN or h-InGaN quantum wells from the epitaxially grown layer.

Figure 25:
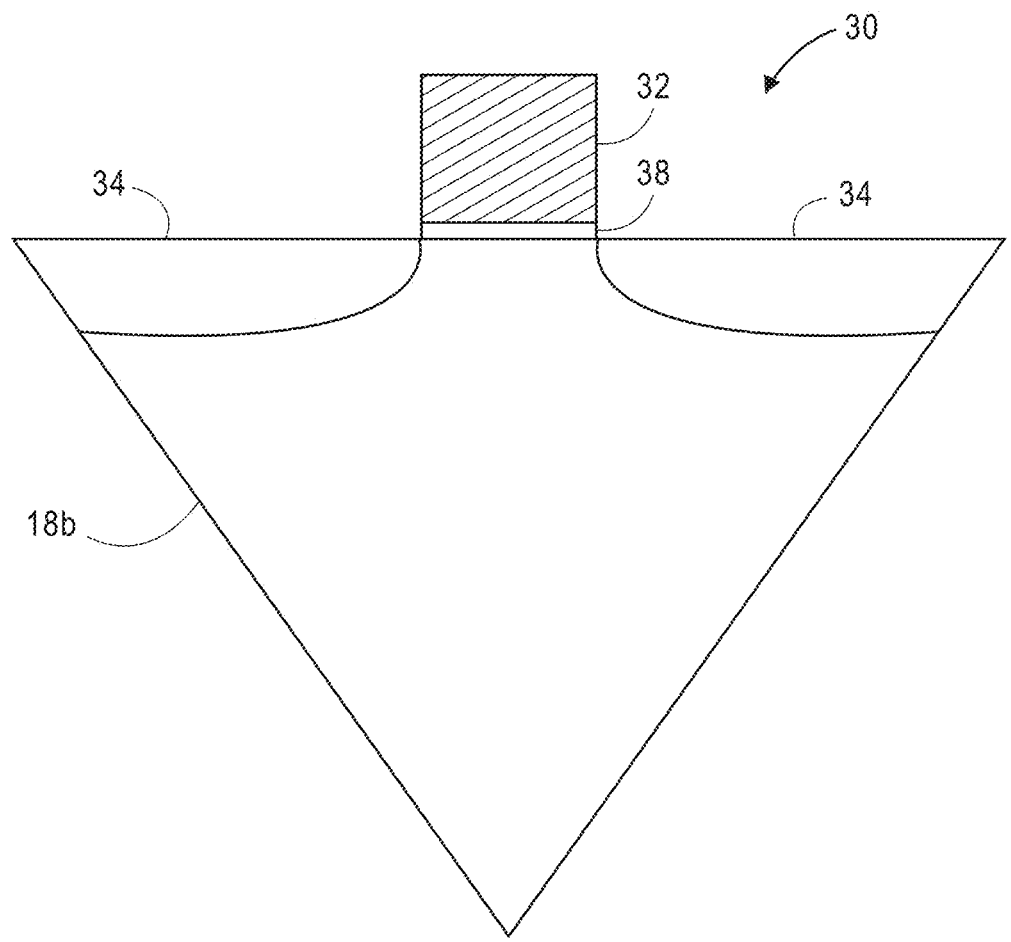
FIG. 25 illustrates a transistor, according to an embodiment of the present disclosure.
Figure 26A:
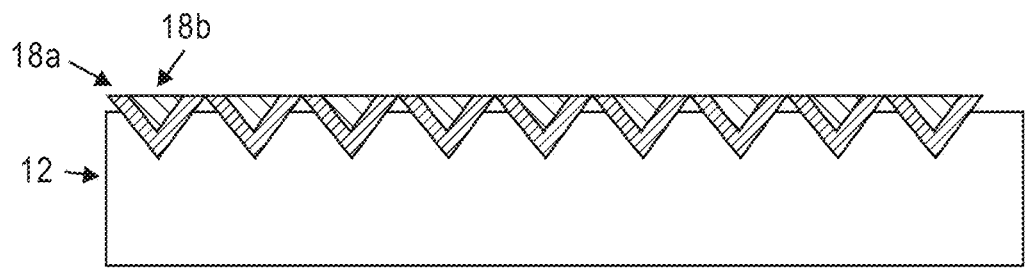
FIG. 26A shows a schematic cross-sectional view of a partially made device being made by the process illustrated by FIGS. 26A to 26F, according to an embodiment of the present disclosure.
Figure 26B:
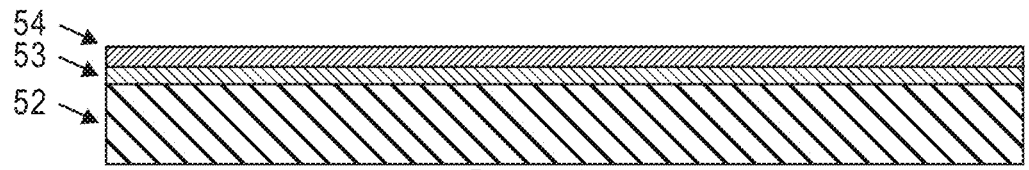
FIG. 26B shows a schematic cross-sectional view of a partially made device being made by the process illustrated by FIGS. 26A to 26F, according to an embodiment of the present disclosure.
Figure 26C:
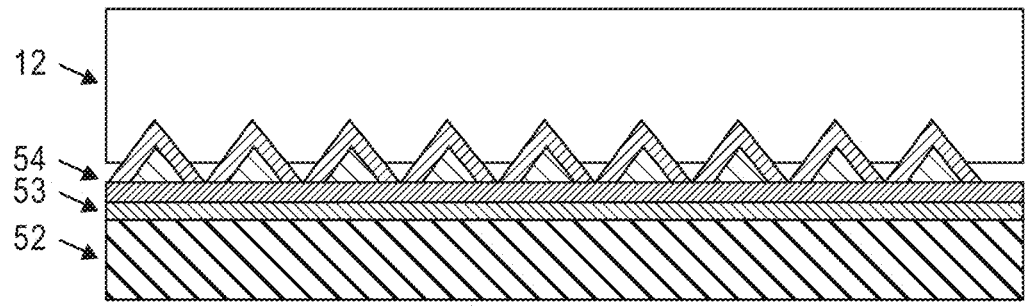
FIG. 26C shows a schematic cross-sectional view of a partially made device being made by the process illustrated by FIGS. 26A to 26F, according to an embodiment of the present disclosure.
Figure 26D:
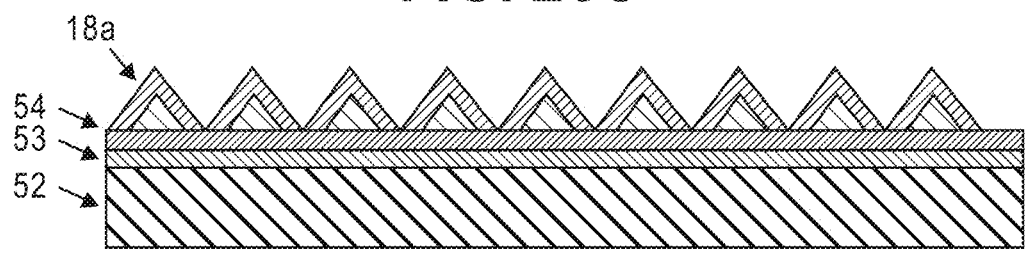
FIG. 26D shows a schematic cross-sectional view of a partially made device being made by the process illustrated by FIGS. 26A to 26F, according to an embodiment of the present disclosure.
Figure 26E:
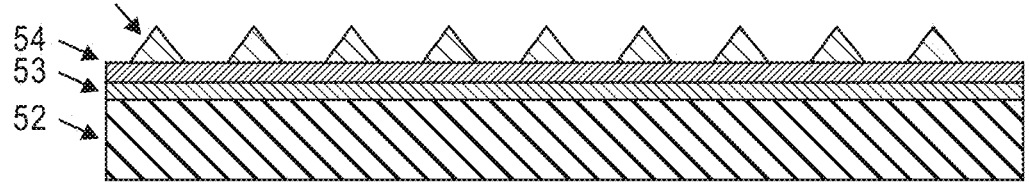
FIG. 26E shows a schematic cross-sectional view of a partially made device being made by the process illustrated by FIGS. 26A to 26F, according to an embodiment of the present disclosure.
Figure 26F:
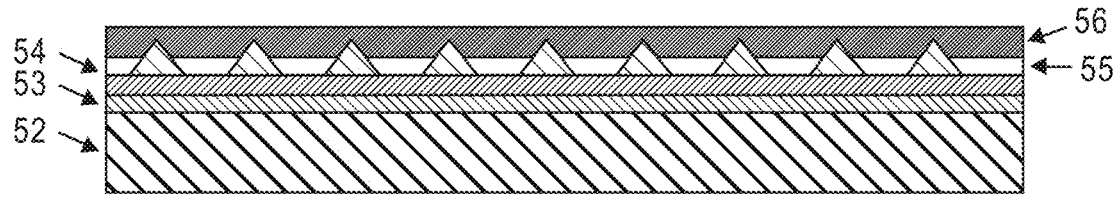
FIG. 26F shows a schematic cross-sectional view of a partially made device being made by the process illustrated by FIGS. 26A to 26F, according to an embodiment of the present disclosure.

FIG. 25 shows one example of a MOSFET transistor 30 in a cross-section of a cubic lattice region 18b, formed according to methods of the present disclosure. The transistor can include a gate electrode 32, source and drain regions 34 and a gate dielectric 38, as is well known in the art. Source and drain regions can be doped with n-type or p-type dopants, as can some or all of the remaining portion of cubic region 18b. Doping to form MOSFET active regions is well known in the art. For example, the source and drain regions 34 can be doped with an n-type dopant and the remaining portion of the cubic lattice region 18b can be doped with a p-type dopant, or vice versa. In an embodiment, portions of the MOSFET can also be formed in hexagonal lattice regions of the heterophase lattice structures described herein.

While transistor 30 is illustrated with the source-drain carrier transport under the length of gate 32 perpendicular to the length direction of the cubic lattice region 18b within the groove, the transistor can be positioned in any desired manner with respect to the cubic lattice region 18b. For example, the position of transistor 30 can be rotated 90° so that the carrier transport under gate 32 is directed parallel to the length of the cubic lattice region within a groove, which runs into the page in FIG. 25.

Figure 27:
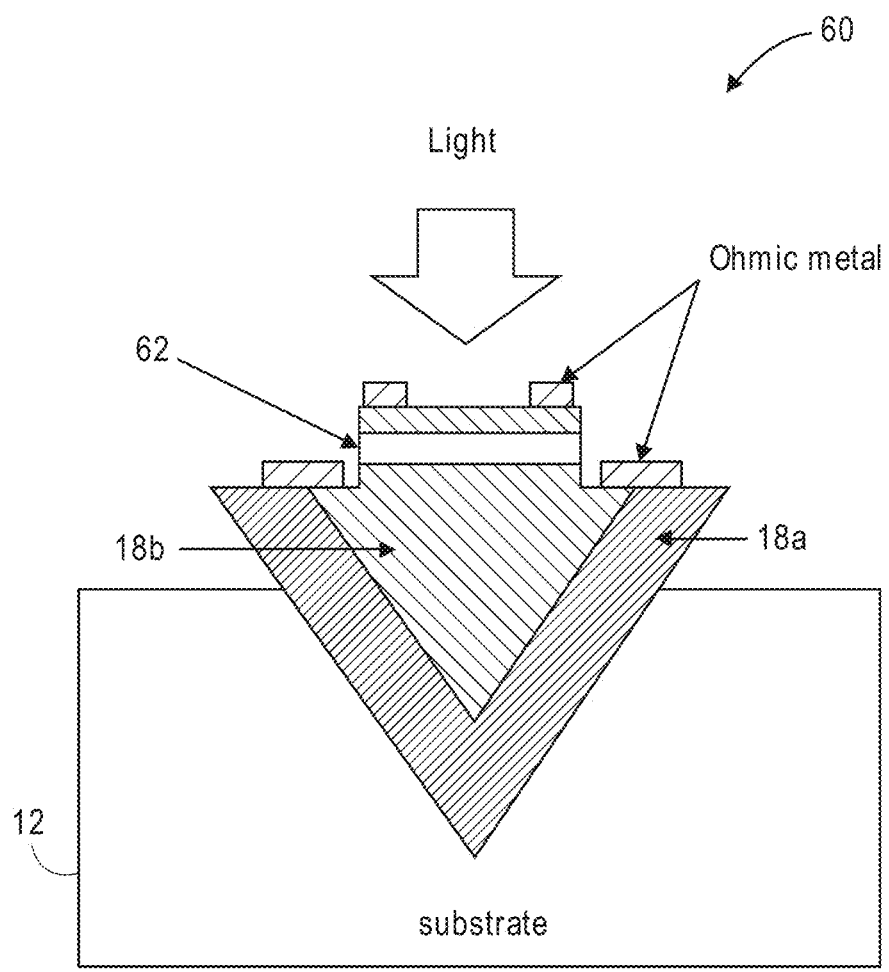
FIG. 27 illustrates a photodetector, according to an embodiment of the present disclosure.

FIG. 27 illustrates one example of a photodetector that employs a cubic lattice region 18b, formed according to methods of the present disclosure. The substrate 12 can be any substrate material disclosed herein, such as, for example, Si or GaAs. Similarly, the regions 18a and 18b can respectively be any hexagonal or cubic semiconductor materials disclosed herein, such as a h-GaN region 18a and a c-GaN region 18b. The active region 62 can be an InGaN quantum well, or any other quantum well material disclosed herein. The regions 18a, 18b and 62 can be doped to form heterojunction(s) so as to provide a functional photodetector, as is well known in the art.

Any desired technique can be used to electrically connect devices formed in the cubic lattice regions with each other and with other devices on the substrate surface. In an embodiment, selective area decomposition of precursor gas is used to form electrical connections to the cubic crystalline devices. Suitable methods for performing selective area decomposition are well known in the art.

Stripe LEDs

To obtain the desired size of cubic lattice regions for the devices of the present disclosure, the widths of the groove 14 can be adjusted. Any suitable size groove widths can be employed. For example, groove widths of 100 nm to 10 μm were investigated, although groove widths outside of this range can be used. Suitable examples within this range include those described above with respect to the width, W, in FIG. 1. It is reasonable to expect that the resulting cubic GaN regions are of similar size as the groove widths, which would be sufficient to fabricate LED devices. Cubic GaN regions with μm-sized widths have been obtained using the methods of the present disclosure.

FIG. 16A illustrates a schematic cross-section of a proposed LED with a cubic GaN active region. Individual stripes can be separated by etching of the material between the v-grooves in any desired manner, which may include etching of layers of cubic crystalline or hexagonal crystalline material or any other material grown between the structures. As an example, portions of overgrown cubic crystalline material can be removed and replace with the interlevel dielectric (ILD) structures shown in FIG. 16B using any suitable photolithography, etching and deposition processes, examples of which are well known in the art. The top contact can be a transparent conductive oxide or a semi-transparent metal. Thus, in an embodiment, the grown GaN layers are patterned by conventional photolithography and etching techniques to isolate the stripes of cubic GaN, as shown, for example, between the ILD structures of FIG. 16B. The quantum-well active region and the p-GaN and n-GaN layers can be formed as part of a single GaN growth sequence that occurs prior to patterning of the stripes. Alternatively, the wafer with the cubic GaN can be patterned, and then a growth mask can be used to selectively re-grow the cubic GaN active region only on the exposed cubic GaN regions.

FIG. 16B illustrates an assembly of multiple stripes of FIG. 16A into a large area LED using an interconnect layer, according to an embodiment of the present disclosure. Metal can be deposited on the back-side and/or front side of the wafer to provide desired contact formation. Since the silicon substrate is non-transparent, the light can be extracted through the top contact, which can be a transparent conducting oxide or a thin, semi-transparent metal or layers of other conductive materials (e.g., graphene or graphene-like materials). Multiple stripes can be electrically connected together with an insulating interlayer dielectric (ILD) and interconnects, which can comprise any suitable conducting material, such as metal, doped polysilicon or graphene, that only occupy a small fraction of the final device, as illustrated in FIG. 16B. In such a configuration the loss of effective light-emitting area could be reduced.

Figure 17:
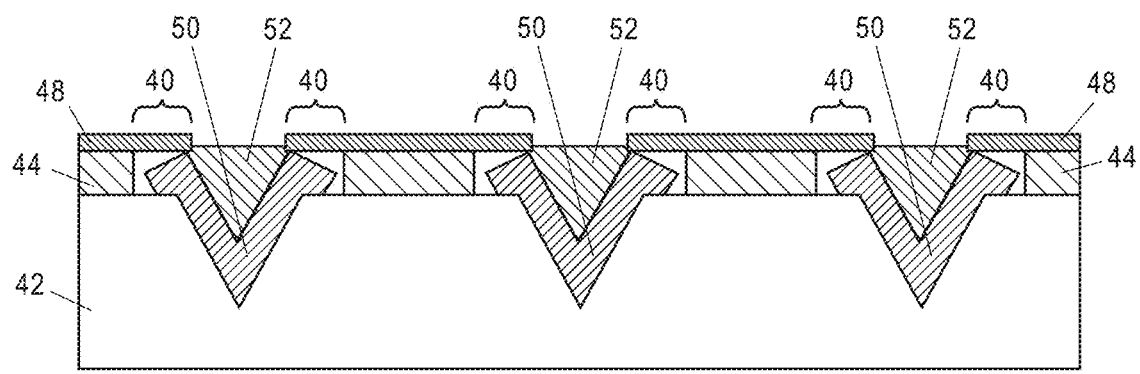
FIG. 17 illustrates a method of using a mask to block h-GaN growth, thereby allowing only the c-GaN to continue growing, according to an embodiment of the present disclosure.

Both geometries shown in FIGS. 16 and 17 retain the Si substrate, which can be an issue for LEDs because of the strong Si visible absorption. In both cases, it may be desirable to remove the silicon substrate. This can be accomplished using any suitable technique. For example, the sample can be bonded to a new handle substrate, such as a transparent, non-transparent, or reflective substrate, with a transparent contact layer such as ITO. The Si substrate can then be selectively removed by any suitable method. In an embodiment, the back side of the substrate can be coated to form the second contact. There are many variants on this scheme familiar to the LED fabrication community, any of which can be employed, as would be understood by one of ordinary skill in the art. One such example of a flip-chip bonding technique for electrical connection to LEDs is described in more detail below. As is well known in the art, the resulting triangular shape of the new top surface that can result from this technique may enhance the light extraction efficiency compared to a plane parallel geometry.

A schematic process sequence for the removal of the Si is shown in FIG. 26. FIG. 26A is the as-grown c-GaN/h-GaN (18b/18a) on a Si substrate (12) as discussed above, including, for example, InGaN quantum wells and p-n junctions. An optional process (not shown) is to fill the spaces between the GaN growth and above the GaN with a dielectric material that could include, for example, $SiO_2$ (such as TEOS) or polymers such as, but not limited to, benzocyclobutene (BCB), which is generally well known in the art as a dielectric for use in microelectronics. This can be followed by an etch back to expose the top surface of the GaN for contacting. FIG. 26B shows a handle wafer (52) with two or more additional thin film layers (53,54) to provide electrical and mechanical contact to the GaN. In FIG. 26C the GaN wafer is inverted and bonded to the handle wafer, making electrical contact to one side of the p-n junction. In FIG. 26D the Si substrate 12 is removed, using a combination of polishing and selective etching of the Si and of any dielectric layer in the case of SOI. FIG. 26E shows an optional step of removing the h-GaN, leaving just the c-GaN material. FIG. 26F shows two additional layers, a dielectric isolation layer (55) and a top contact layer (56). This bonding scheme is well developed in many other cases, such as, for example the bonding of infrared detector arrays, fabricated in materials such as InSb, HgCdTe or GaAs to silicon read out integrated circuits. Such bonding is routinely carried out with many millions of individual contacts. The steps presented here are exemplary only. Further process details can be worked out following well known industry practice adapted for GaN materials, as would be readily understood by one of ordinary skill in the art.

From a processing stand point, it would be ideal to have planar cubic GaN films, so that all technologies and processes for regular LEDs may be used. To obtain these continuous films, a growth mask comprising, for example, $SiO_2$, can be employed so that only the cubic phase can grow further and these regions can then coalesce by lateral overgrowth over the mask. The growth of these structures could include a GaN capping layer to clad the ends of the QWs to reduce nonradiative transitions at the interface with amorphous materials (interlayer dielectric or air).

FIG. 17 illustrates a method of using a mask 48 to block the h-GaN, thereby allowing only the c-GaN to continue. This method is described in more detail in U.S. Pat. No. 8,313,967, issued on Nov. 20, 2012, the disclosure of which is hereby incorporated by reference in its entirety. Once the h-GaN is blocked the rest of the structure including the InGaN QWs can be added. Then the growth of the c-GaN can be continued to coalescence, or a segmented device can be formed. This method can be applied to grow layers of any of the cubic crystalline materials described herein.

Patterning conductive layers, which can comprise metal, doped polysilicon or any other conductive material suitable for device fabrication, for electrically connecting the devices of the present application can be performed by any suitable method. Optical lithography tools are commercially available that have the alignment and patterning capability to form electrical contacts useful in sub micron dimension cubic lattice regions of the present disclosure. However, such lithography tools are currently relatively expensive, and without such tools, the experimental realization of the proposed electrically connected stripe LEDs, or other device cubic lattice devices of the present disclosure, can prove challenging. To provide a method that can utilize less expensive tools for alignment and patterning of the cubic lattice regions, an approach was adopted that employs selective area decomposition of a precursor gas. This method includes providing an array of insulated pads for probing. In an embodiment, this was accomplished using photolithography and lift-off, as discussed in greater detail below. However, any suitable method could be employed for providing the desired electrical contacts.

Regions for the contact pads were defined by photoresist, and electron-beam evaporation was used to deposit a stack of $SiO_2$ (200 nm), Ti (20 nm), and Au (100 nm). A fine metal (Pt) contact was deposited reaching from the contact pad to the center of an individual GaN stripe by beam induced machining (BIM). Other insulators and metals can be used instead of $SiO_2$, Ti and Au. Other metals suitable for contacts, such as tungsten, can also be used instead of Pt.

BIM is usually performed by the use of a focused ion beam (FIB) tool to remove material. However, BIM can also be used to deposit new material, including conductive material, such as metal or doped polysilicon; dielectric material or semiconductive material. Selective decomposition of precursor gas is one form of BIM that can be employed, although other forms of BIM could also be used.

During BIM, the gas can be supplied by means of a gas injection system that transports the gas near the region where the planned deposition will occur. The precursor gas is decomposed by a beam of electrons or ions, and leaves a residue of material determined by the precursor gas in the area where the beam has induced the decomposition. The beam diameter, scanning rate, duration and gas flow rates determine the final form and amount of material that gets deposited.

Figure 18:
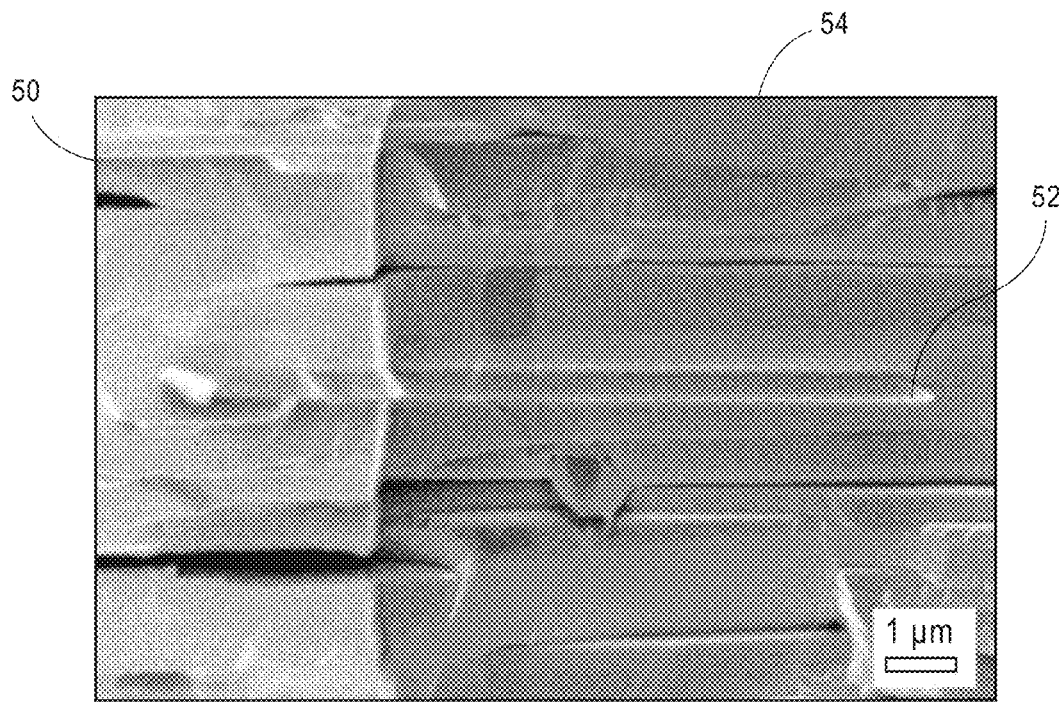
FIG. 18 shows an exemplary cubic GaN LED device.

As an example, a precursor gas containing platinum and the electron beam of a commercially available combined SEM-FIB tool was used for the selective decomposition. This yielded an approximately 100 nm wide metal line. The thickness of this metal line was controlled by the deposition time, and a duration of several tens of seconds yielded thicknesses on the order of 1 μm. The result for one cubic GaN LED device is shown in FIG. 18. For this device, the part of the Pt contact 52 on the GaN stripe 54 has a length of 7.8 μm. The contact to the n-side of the structure (not shown) was made by soldering the Si-wafer to a copper block. Part of the probing pad 50 is visible, and the Pt metal line in the center contacts to the p-side of the GaN stripe.

Laser Structures

In an embodiment, the stripes of the LED devices of the present disclosure can form one dimensional waveguide structures with only a small number of modes. This geometry is well suited to the realization of laser structures. The number of modes is roughly given by $A/(\lambda/2n)^2$ where A is the cross section of the stripe and n is the refractive index of the GaN. The number of modes can vary depending on the device. For the example structure of the LED device of FIG. 18, the number of modes was roughly about 25. A smaller v-groove would result in a significantly reduced number of modes.

The length of the stripes can be any suitable length, limited only by the lithographic capability and size of the substrate. Example nanowire structures have been made that are about 1 cm, which is believed to be far longer than other known nanowire structures. Example lengths of the stripes can range from about 10 nm or less to about 50 cm, such as about 1, 10 or 100 microns to about 1, 10 or 30 cm.

The material can cleave perpendicular to the stripe, providing good mirror surfaces. Even without a good cleaved surface, the small number of modes means that there is high reflectivity back into the propagating modes in the stripe.

The Si is highly absorbing to radiation at visible wavelengths, which can potentially be problematic for laser structures. However, as discussed above, there are straightforward approaches to removing the Si. Another possible problem is that the h-InGaN quantum wells to the side of the c-InGaN wells may provide a lower energy level, siphoning carriers from the c-InGaN. This can be addressed by removing the h-GaN QW regions. FIG. 22 shows a region where focused ion-beam milling has been used to remove the h-GaN regions. Alternatively the blocking technique of FIG. 17, discussed above, can be applied before the growth of the InGaN QWs.

Both electrical and optical pumping are appropriate for investigating lasing possibilities. One of ordinary skill in the art would be readily able to implement the devices described herein to fabricate lasers for either electrical or optical pumping.

Figure 20A:
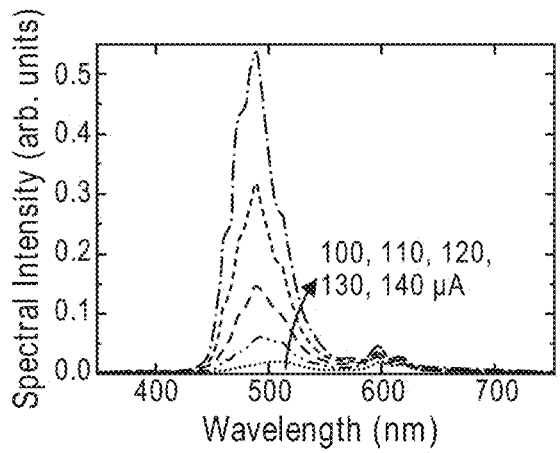
FIG. 20A shows a graph of data collected from several examples of the present disclosure.
Figure 20B:
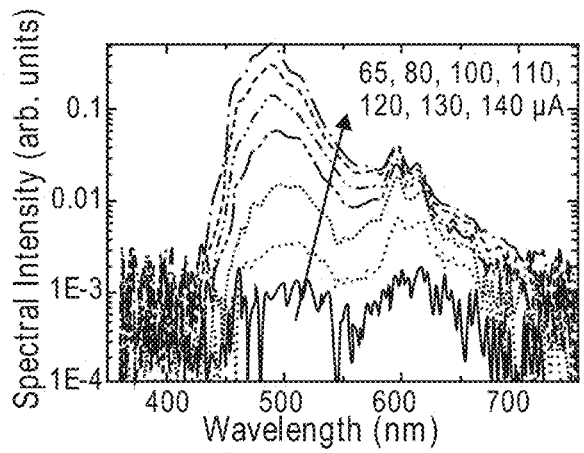
FIG. 20B shows a graph of data collected from several examples of the present disclosure.
Figure 21A:
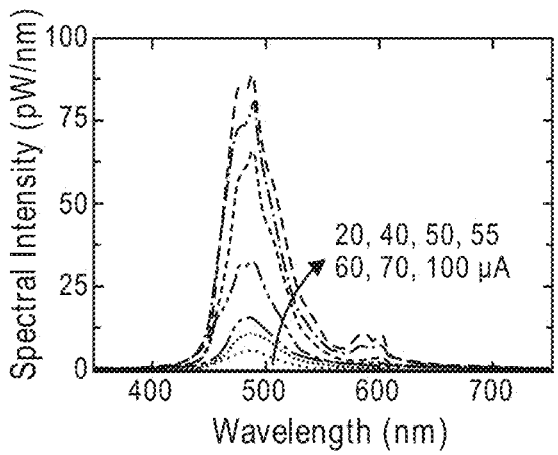
FIG. 21A shows a graph of data collected from several examples of the present disclosure.
Figure 21B:
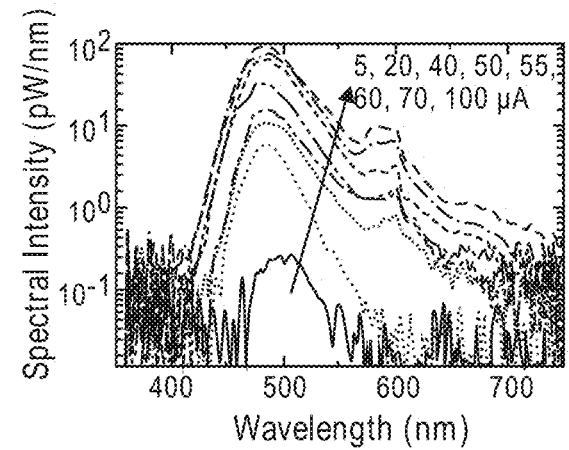
FIG. 21B shows a graph of data collected from several examples of the present disclosure.

The light-output power vs. current graphs for the same cubic GaN LEDs as in FIGS. 20 and 21 are shown in FIGS. 23A and 23B, respectively. This data shows that in both devices there is a current range in which the light output power increases faster than linearly proportional to the current. Specifically, for FIG. 23A this is observed in the range of 50 μA to 140 μA. Specifically, for FIG. 23B this is observed in the range of 40 μA to 60 μA. Both those findings are indications that light amplification by stimulated emission may be occurring. Furthermore, it is possible that by the specifics of the described structure an optical cavity may have been formed that could act as a resonator to support such stimulated emission to induce laser diode action in these device structures.

Figure 28A:
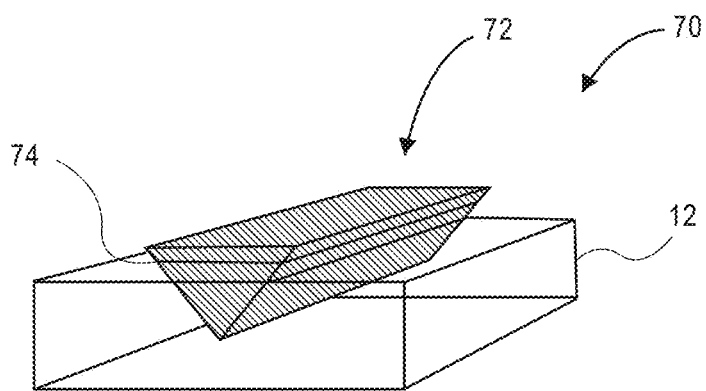
FIG. 28A illustrates a laser geometry in an as-grown configuration.
Figure 28B:
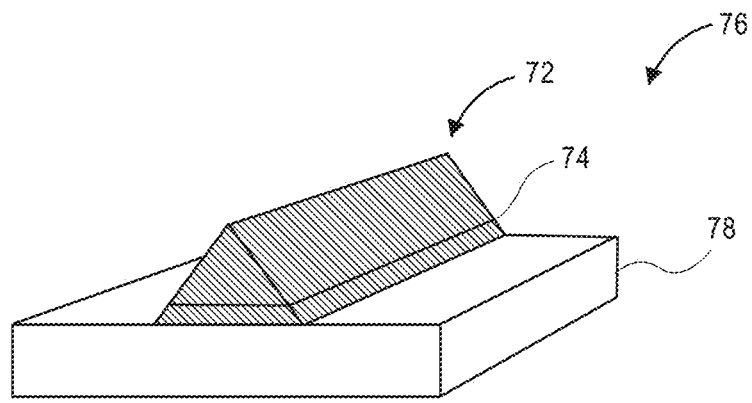
FIG. 28B illustrates the laser geometry after removal of the semiconductor substrate.

Examples of laser devices are illustrated by FIGS. 28A and 28B. FIG. 28A illustrates a quantum well laser device 70 comprising a semiconductor substrate 12 on which a heterophase lattice region 72 is formed. For example, the region 72 can comprise outer h-GaN and inner c-GaN lattice regions. Any of the other group III nitrides as described herein can be employed in place of GaN. Laser device 70 includes a quantum well region 74, as is well known in the art. Quantum well region 74 can comprise a suitable group III nitride material, such as InGaN. Semiconductor regions above and below the quantum well can be doped with p-type or n-type dopants, as is well known in the art. For example, a region immediately below the quantum well 74 can be doped with n-type dopants and a region immediately above quantum well 74 can be doped with p-type dopants, or vice versa. In an embodiment, multiple quantum wells can be employed instead of a single quantum well, as is also well known in the art.

FIG. 28B illustrates another embodiment of a device 76 in which the Si substrate 12 has been removed and the heterophase lattice region 72 has been bonded to another substrate 78. The heterophase lattice region 72 can be made of the same materials and/or doped as described for the device of FIG. 28A. Multiple quantum wells can be formed if desired. Substrate 78 can be any suitable material, such as doped or undoped semiconductor or insulator material. In an embodiment, the substrate 78 is transparent to the radiation emitted by the quantum well laser device 76.

The present disclosure teaches, among other things, growth on sub-am-sized and μm-sized V-grooves in silicon as a method for forming cubic GaN structures and cubic GaN LEDs. A contrast change in SEM is observed between the GaN near the groove sidewalls and the material near the groove center. These cubic regions can have a width on the order of, for example, several hundred nanometers. For undoped and MQW structures, the cubic phase in the stripe center was confirmed by electron backscattering diffraction (EBSD) phase identification. The top surface of the cubic region in the MQW structure exhibited a (001) plane.

Band-edge emission and luminescence from GaInN/GaN MQWs in cubic GaN were observed by cathodoluminescence (CL).

Additional Device Structures and Methods for Making Devices

Figure 29A:
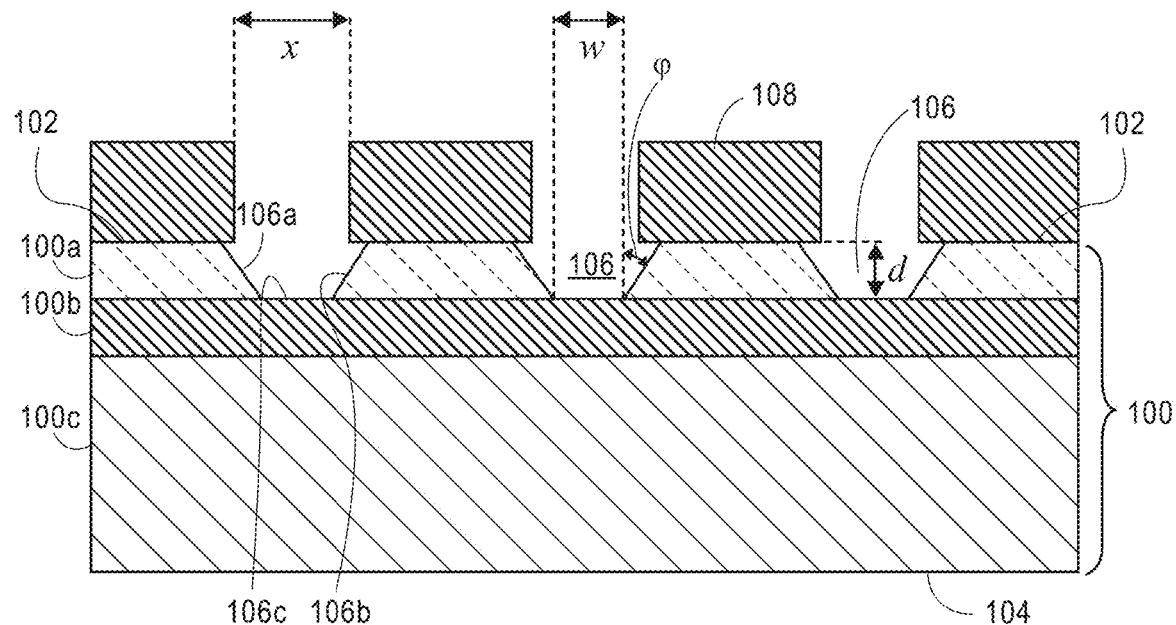
FIG. 29A shows a schematic cross-sectional view of a partially made device being made by the process illustrated by FIGS. 29A to 29J, according to an embodiment of the present disclosure.

An embodiment of the present disclosure is directed to a method of forming a semiconductor structure. In an embodiment, as shown in FIG. 29A, the method comprises providing a substrate comprising a first material portion and a single crystal silicon layer on the first material portion, such as, for example, a silicon-on-insulator substrate 100. Silicon-on-insulator substrate 100 comprises a major front surface 102, a major backside surface 104 opposing the major front surface 102, and a plurality of grooves 106 positioned in the major front surface. The silicon-on-insulator substrate 100 comprises a single crystal silicon device layer 100a over a buried insulator layer 100b, which in turn is positioned on a bulk layer 100c. As an example, device layer 100a and bulk layer 100c can both be single crystal silicon, and buried insulating layer 100b can be a silicon dioxide layer. Alternatively, single crystal silicon 100a can be on any other suitable base substrate that provides sufficient structural support for, and etch selectivity with, the single crystal silicon layer 100a, including base substrates that include a single conductive, semiconductive or insulative material or two or more of such materials, and may or may not be considered a silicon-on-insulator type substrate. In an embodiment, the bottom portion of the truncated v-grooves is defined by a portion of the buried insulator layer 100b. One or more of the plurality of grooves 106 can be truncated v-grooves, each truncated v-groove comprising a first diagonal sidewall 106a, a second diagonal sidewall 106b opposing the first diagonal sidewall, and a bottom portion 106c that is parallel with the major front surface 102 of the substrate 100. The diagonal sidewalls 106a and 106b are {111} crystal faces of the single crystalline silicon 100a.

Figure 30A:
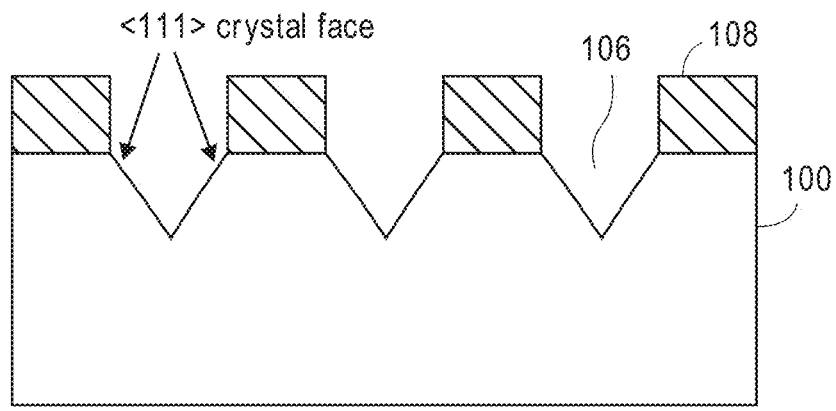
FIG. 30A illustrates an example of a silicon substrate 100 having a v-groove 106 formed therein.
Figure 30B:
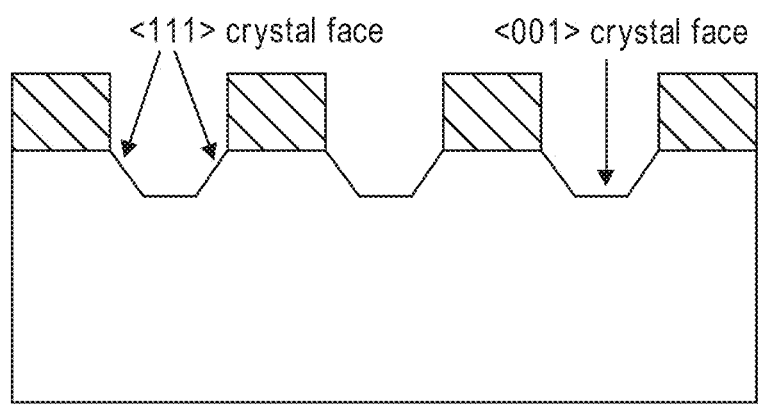
FIG. 30B illustrates an example of a silicon substrate 100 having a truncated v-groove 106 formed therein.

Other suitable substrates and/or groove types can be employed in place of the silicon-on-insulator substrate having truncated v-grooves shown in FIG. 29A. For example, either truncated v-grooves or v-grooves that are not truncated can be formed in a silicon-on-insulator substrate that has a device layer 100a that is thick enough to form the groove completely in the device layer (e.g., the bottom surface 106c of the groove is silicon). FIG. 30A illustrates an example of a substrate 100 having a v-groove 106 formed therein. FIG. 30B illustrates an example of a substrate 100 having a truncated v-groove 106 formed therein. The substrate 100 of FIGS. 30A and 30B can be any of the substrates described herein, such as single crystal silicon substrates or single crystal silicon formed on a base substrate, such as SOI substrates, where the silicon in the substrate has a (001) exposed major surface for processing (e.g., the surface into which the grooves are formed is a (001) silicon facet).

Referring to FIG. 29A, a patterned insulating layer 108 is formed on the major front surface of the substrate 100 by any suitable method, such as conventional deposition, photolithographic and/or etching techniques. One of ordinary skill in the art would readily be able to form the patterned insulating layer 108. In an embodiment, the method can comprise depositing an insulating layer on the major front surface of the substrate prior to depositing the buffer layer, patterning the insulating layer to expose stripes of the substrate, and forming the plurality of grooves 106 in the exposed substrate regions. Insulating layer 108 may or may not be protected during etching of the grooves 106, depending on the material used for insulating layer 108 and the type of etch chemistry employed. In an embodiment, the patterned insulating layer 108 comprises a material that is stable at growth temperatures of GaN, such as about 1000° C. or more. In an embodiment, the insulating layer 108 can be deposited prior to formation of the grooves 106 and can act as an etch mask during formation of the grooves 106. Etching to form the grooves 106 can be carried out using any desired etching technique suitable for forming a v-groove in a silicon substrate. In an embodiment, grooves 106 are anisotropically wet etched with a KOH-chemistry that selectively slows dramatically on the {111} faces. Other suitable etch chemistry can be employed. The etch can be carried out for a sufficient length of time so as to undercut the edges of insulating layer 108, as shown in FIG. 29A. In this case, the over-etching of the device layer 100a produces grooves 106 that have a greater width than the opening in the insulating layer 108. Alternatively, the etch can be carried out so that no such undercut structures are formed, as shown in FIG. 30B.

As described above, the v-grooves etched into a Si(001) facet expose {111} sidewall facets. The grooves can have any of the groove shapes and/or dimensions as described herein. The grooves 106 can have any desired length. For example, they can extend completely across a wafer. As another example, the length can be about 10 microns to about 1000 microns or more, such as about 50 microns to about 500 microns. In an embodiment, the length of the grooves is at least 5 times the depth of the grooves, such as 10 to 10,000 times the depth, where the length is the dimension of the groove into, and perpendicular to the surface of, the drawings and the depth is the greatest depth as measured between the upper major surface of device layer 100a and the bottom portion 106c of the grooves. Thus, the epitaxial structures grown in the grooves 106 can be similar to a triangular cross section fiber. The dimensions can be controlled to provide for single mode for propagation along the groove. For example, the dimensions of the cross section of the fiber can be controlled to fulfill the geometric requirements for the propagation of a specific guided optical mode, e.g. single mode propagation similar to that in many optical fibers and laser diode resonators.

Figure 29B:
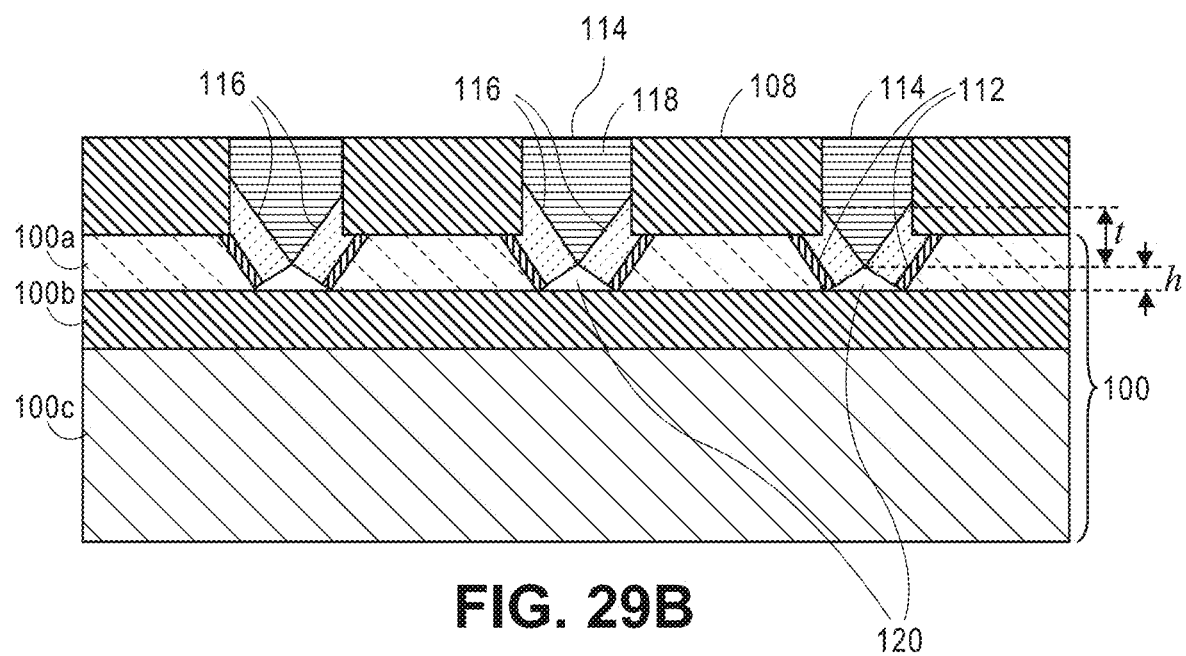
FIG. 29B shows a schematic cross-sectional view of a partially made device being made by the process illustrated by FIGS. 29A to 29J, according to an embodiment of the present disclosure.

Referring to FIG. 29B, a buffer layer 112 is formed in one or more of the plurality of grooves 106. Any suitable buffer layer material can be employed. As an example, buffer layer 112 can be epitaxially deposited and can be any of the buffer layers described herein. In an embodiment, as shown in FIG. 29B, the buffer layer 112 can be selectively deposited on the sidewalls 106a and 106b. Alternatively, buffer layer 112 can be formed over the entire surface of groove 106, including the bottom 106c and sidewalls 106a and 106b.

A semiconductor material 114 is epitaxially grown in one or more of the plurality of grooves 106 over the buffer layer 112. The epitaxially grown semiconductor material 114 comprises a hexagonal crystalline phase layer 116 and a cubic crystalline phase structure 118 disposed over the hexagonal crystalline phase layer 116 in one or more of the plurality of grooves 106.

During the epitaxially growing of semiconductor material 114, a gap 120 is formed between the hexagonal crystalline phase layers 116 and the bottom portion of the truncated v-groove 106c. In an embodiment, at least a portion of the gap 120 is filled with a gas, such as air or any other suitable gas. In another embodiment, at least a portion of the gap 120 is filled with a buffer layer material, such as material from the formation of buffer layer 112. While the gap is depicted in the figures as having a triangular cross-section, the gap cross-section may have other shapes. In an embodiment, the cross-section is a triangle having the following dimensions:

a bottom side that is the width of the bottom 106c of the groove; and sides given by the combined thickness of the buffer layer 112 and the hexagonal crystalline phase layer 116 at the point of collision of the hexagonal crystalline phase layer 116 from opposite sides of the groove, which is the point at which the cubic crystalline phase begins. All or substantially all of the area within that triangle may be a void (e.g., a gas filled gap) where no material has grown at a sufficient rate to hinder the collision of the growth fronts from the opposing sides of the groove in the top apex of the triangle. The void and its dimensions in respect to the width and depth of the groove reflect a design parameter for the controlled nucleation of the cubic phase GaN. While it is not necessary that gap 120 be completely empty of material deposits, it preferably does not fill from the bottom up before the two sides of the hexagonal crystalline phase layer 116 have collided In an embodiment, the truncated grooves 106 may provide better control of epitaxial growth compared to a complete (untruncated) groove. As described above, where the groove is truncated the hexagonal crystalline structures that form on the {111} sidewalls grow a certain distance before colliding with each other. In truncated grooves with bottom-width, w, and depth of groove, d (FIG. 29A), the cubic crystalline phase structure will first nucleate at a height, h (FIG. 29B), above the groove bottom, which coincides with the point at which the two hexagonal crystalline phase structures meet. For example, this height of nucleation can be equal to $$\frac{w}{2}\tan\varphi,$$

where the angle, φ=35.25°, and is defined by the underlying cubic substrate crystal and is equal to half the angle defined by the intersection of two {111} planes. The width, w, of the flat bottom of the grooves 106 may be chosen in such a way that the cubic crystalline phase structure 118 will first nucleate at a specific height with respect to the bottom of the groove. For example, if $$w < \frac{2d}{\tan\varphi},$$

then the cubic crystalline phase structure will nucleate beneath the top surface of the substrate as in FIG. 29B. The cubic crystalline phase will reach the width of the opening in the insulating layer, x, at a thickness, $$t = \frac{x}{2\tan\varphi}.$$

Further, the thickness of the insulating layer 108 can be chosen in such a way that, in combination with the protrusion of the insulating layer 108 over the groove 106, the further growth of the hexagonal crystalline material 116 (e.g., hexagonal GaN growth, interchangeably referred to herein as wurtzite form) is arrested by the insulating layer 108, as shown in FIG. 29B. To accomplish this, the thickness of the insulating layer 108 can be greater than or equal to h+t−d. In this manner, the hexagonal crystalline material can be blocked from growing beyond the top surface of the insulating layer 108 if desired, so that the top surface of the epitaxially grown material is dominated by cubic crystalline phase material as compared to the hexagonal crystalline phase, as illustrated in FIG. 29B.

In an embodiment, epitaxially growing the semiconductor material also comprises forming at least one p-n junction and/or at least one quantum well (similar to quantum well 74 discussed above) in the cubic crystalline phase structure 118. In an embodiment in which the resulting semiconductor device being formed is a light emitting diode, super-luminescent light emitting diode or laser, the epitaxially grown cubic crystalline phase structure 118 and optionally the hexagonal crystalline phase 116 semiconductor can include an n-type layer 118a (FIG. 29D), InGaN based active region 118b that may include, for example, one or more quantum wells, an optional AlGaN-based blocking layer 118c and a p-type layer 118d (e.g., GaN p-layer). These layers can be grown in succession as part of the cubic crystalline phase structure 118. The p-type GaN can then be activated by any suitable method, such as by rapid thermal annealing in $N_2$ ambient or electron beam irradiation, as is known by the person of ordinary skill in the art. Forming the n-type layer first may be advantageous because making the n-type material more conductive is relatively easy compared to a p-type layer. That said, in an alternative embodiment the polarity is reversed, so that the p-type layer is formed first and the n-layer is formed last. Forming such n-type and p-type layers for carrier injection, as well as forming quantum wells for smaller bandgap and carrier confinement, is well known, and providing suitable active regions for an LED or laser type device in view of the guidance provided herein would be well within the ordinary skill of the art.

A major advantage of the cubic crystalline materials, such as c-GaN, is that the (001) face of these materials is nonpolar. Thus, the strain associated with adding the InGaN quantum wells does not induce a polarization field that acts to separate electrons and holes in a polar device.

Figure 29C:
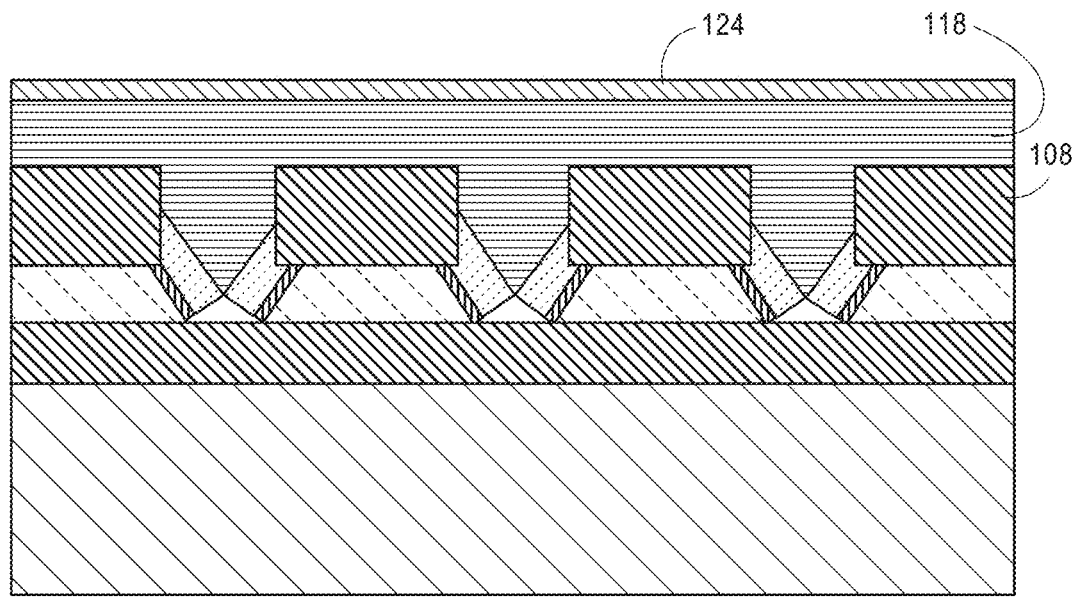
FIG. 29C shows a schematic cross-sectional view of a partially made device being made by the process illustrated by FIGS. 29A to 29J, according to an embodiment of the present disclosure.

The growth of the semiconductor material 114 can be stopped at any desired time. In an embodiment, the growth of the semiconductor material 114 can continue until the cubic crystalline phase structure 118 extends over insulating layer 108, as shown in FIG. 29C. Doing so may provide more flexibility as to where the quantum wells can be positioned (e.g., in the groove structures or in the coalesced cubic crystalline material outside of the grooves). In embodiments where the cubic crystalline phase growth extends over the insulating layer 108, the silicon 100a can be retained, or removed as discussed below. In an alternative embodiment, growth of the semiconductor material 114 can be stopped when the semiconductor material is flush, or substantially flush, with a top surface of insulating layer 108, as shown, for example, in FIG. 29B.

Figure 29D:
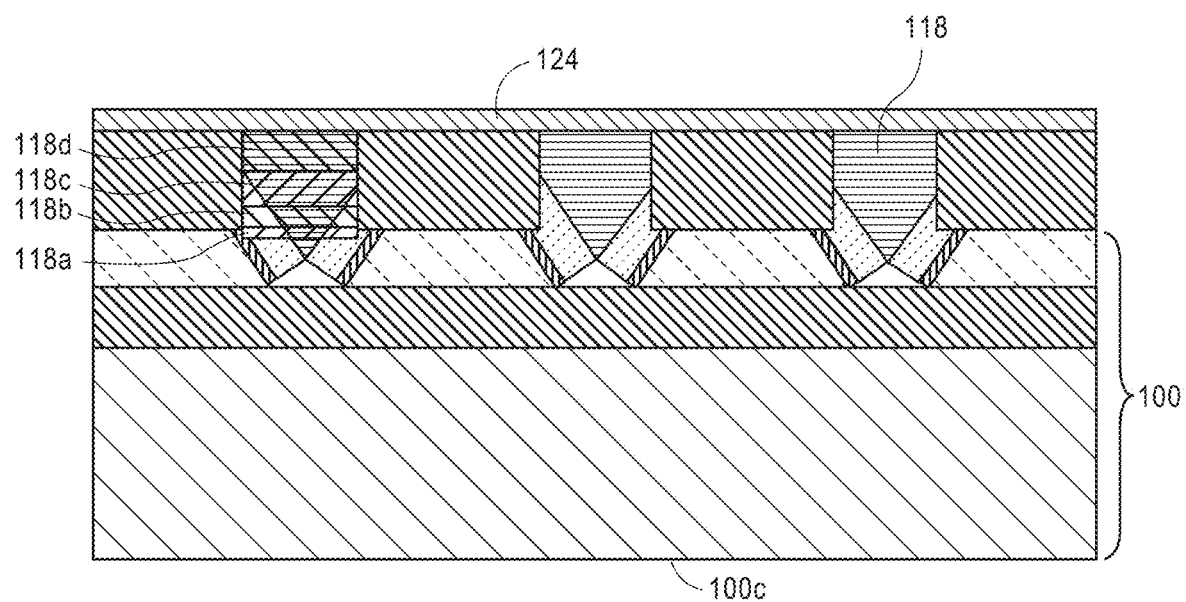
FIG. 29D shows a schematic cross-sectional view of a partially made device being made by the process illustrated by FIGS. 29A to 29J, according to an embodiment of the present disclosure.
Figure 32:
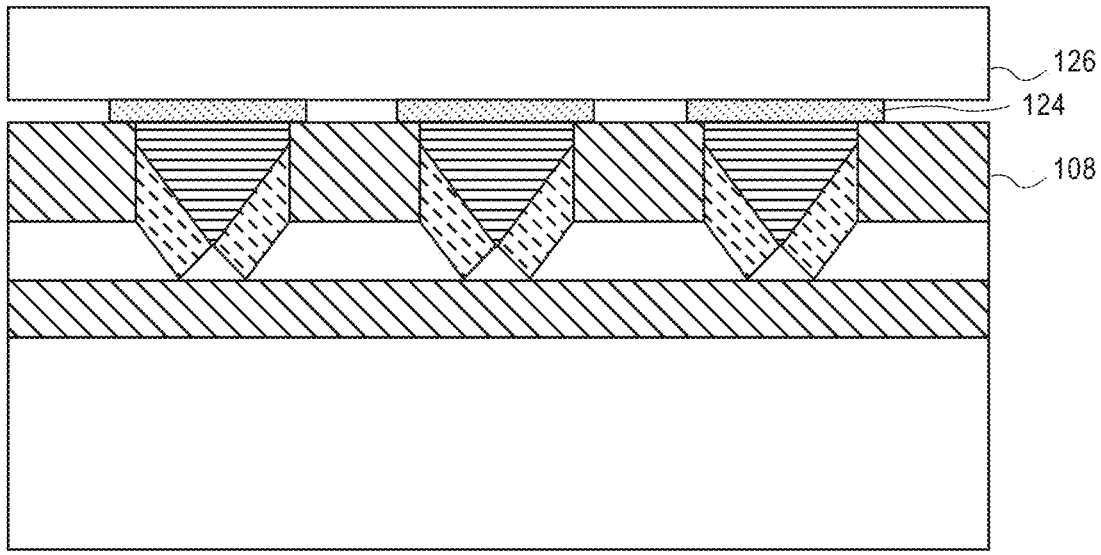
FIG. 32 shows an epitaxially grown semiconductor material bonded to a handle substrate, according to an embodiment of the present disclosure.

Referring to both FIGS. 29C and 29D, a backside contact 124 can be formed over the cubic crystalline phase structure 118. The backside contact 124 can be patterned or not patterned. An example of a patterned contact 124 is shown in FIG. 32. Any suitable method for forming the backside contacts can be employed, and a variety of suitable methods are well known in the art. In an embodiment, where the device being formed is an LED, a p-side metal is deposited and annealed after epitaxial growth is completed and the p-type GaN layer has been activated. The p-side metal can provide electrical contact to the p-GaN and also may include additional layers so as to act as a backside mirror. This can help to control the direction of light emission. Choosing suitable additional layers to add to provide a backside mirror is within the ordinary skill of the art.

Figure 33:
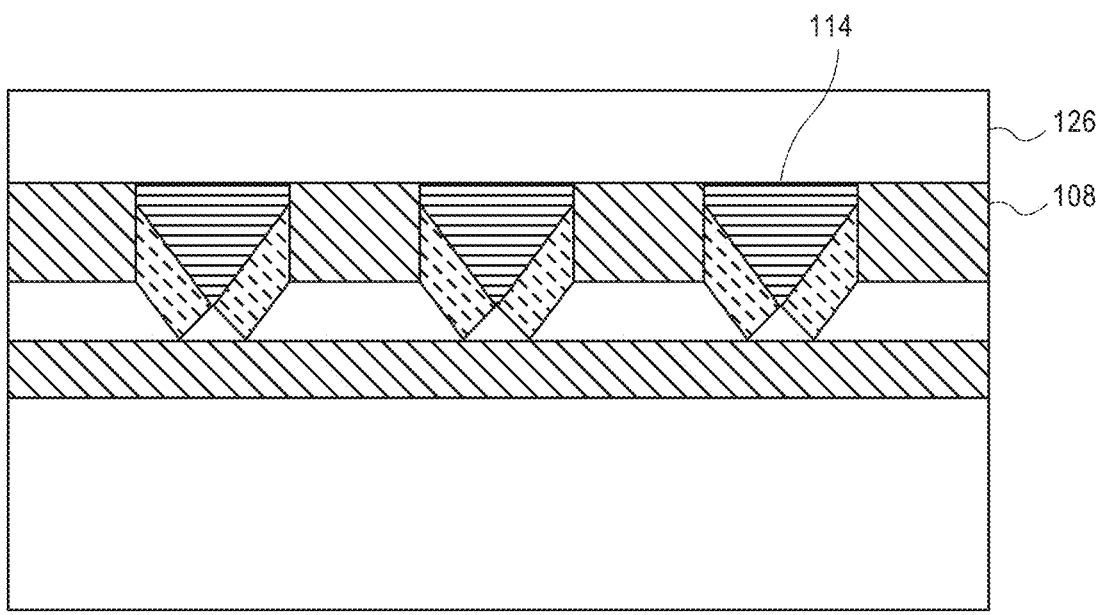
FIG. 33 shows an epitaxially grown semiconductor material bonded to a handle substrate, according to an embodiment of the present disclosure.

As shown in FIGS. 32 and 33, the epitaxially grown semiconductor material can be bonded to a second substrate 126, sometimes referred to as a "handle" substrate. For example, the second substrate 126 can be attached to the backside contact 124, as shown in FIG. 32. Any of FIGS. 29B to 29J and 31B to 31L can include a handle substrate attached to the backside contact 124, such as by any suitable bonding process. Alternatively as shown in FIG. 33, in an embodiment where a backside contact 124 is not employed, the second substrate 126 can be attached directly to the cubic crystalline phase structure 118 and optionally the insulating layer 108, depending on whether or not the cubic crystalline phase structure 118 is grown in a continuous layer over the insulating layer 108, as is shown in FIG. 29C.

The handle substrate 126 can optionally be transparent if light is to exit the device through the handle substrate. If thermal issues are not important, the material used for the handle substrate can be, for example, fused silica. If thermal issues are important, as they are in LEDs for lighting (as an example), the material can be sapphire or diamond, or another high thermal conductivity material. In an example, the handle substrate 126 can have matching electrical traces that are indium soldered to the contacts 124 on the GaN, or a conductive glue can be used. There are many other handle substrate variants that can be used, and the optimal choice depends on many factors.

The purpose of the handle substrate is to provide mechanical support for the epitaxially grown semiconductor 114 after the Si wafer is removed. It is noted that the figures are not to scale, and the thickness of the handle substrate 126 can be, for example, 100 times or more thicker than the epitaxially grown semiconductor 114 in the grooves (e.g., epitaxial grown semiconductor can be on the order of about 1 micron; while the handle wafer can be greater than 100 microns thick.)

Figure 29E:
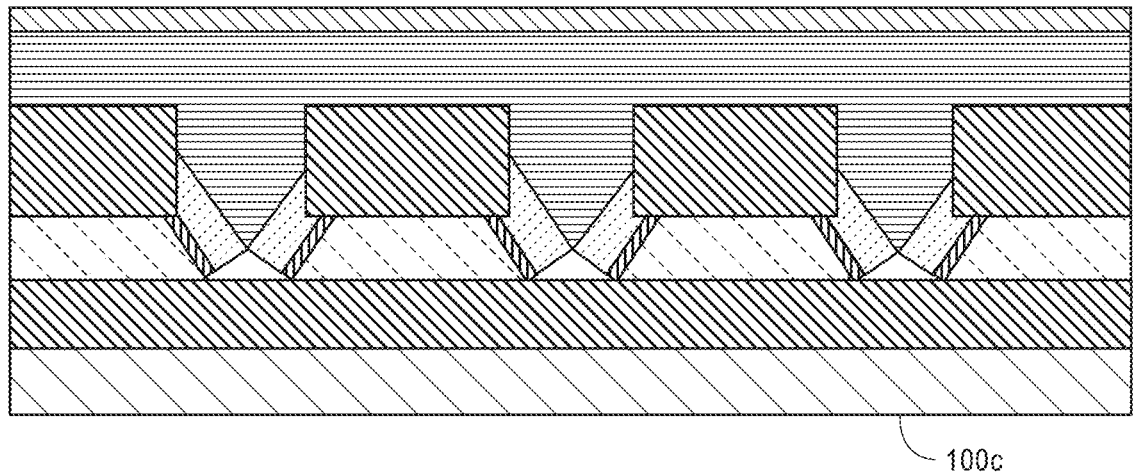
FIG. 29E shows a schematic cross-sectional view of a partially made device being made by the process illustrated by FIGS. 29A to 29J, according to an embodiment of the present disclosure.

The method can comprise removing at least a portion of the substrate 100 and optionally the hexagonal crystalline phase layer 116. FIGS. 29E to 29I show an exemplary process for removing the entire silicon-on-insulator substrate and the hexagonal crystalline phase layer. As shown in FIG. 29E, the bulk portion 100c of the silicon-on insulator substrate is thinned to a desired thickness, such as by using mechanical and/or chemical processes. Starting thicknesses for the bulk portion 100c can be any thickness, and as an example, may be about 200 microns to 1000 microns or more, such as about 300 microns. After thinning, the remaining thickness of bulk portion 100c can range, for example, from about 5 to about 50 microns, such as about 10 to about 20 microns.

Figure 29F:
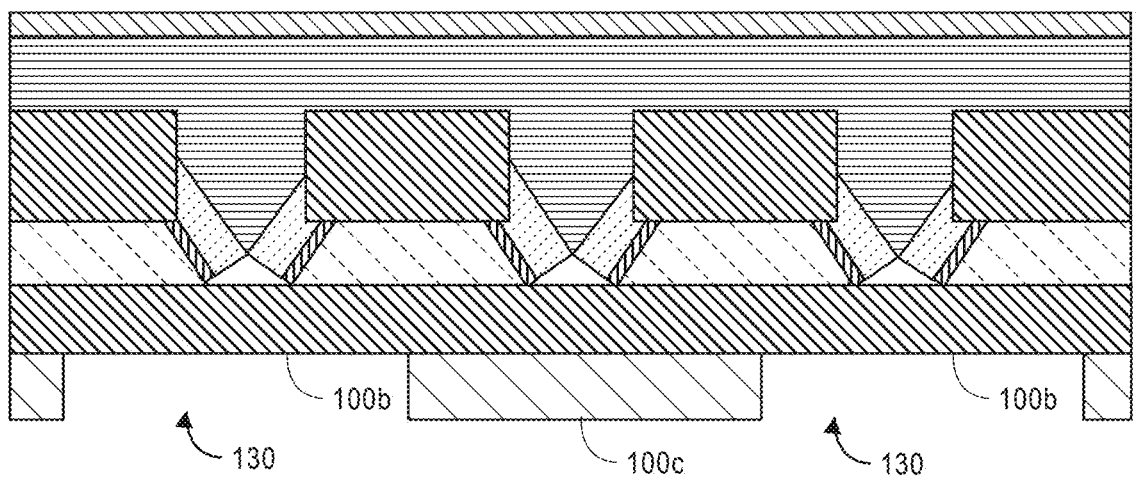
FIG. 29F shows a schematic cross-sectional view of a partially made device being made by the process illustrated by FIGS. 29A to 29J, according to an embodiment of the present disclosure.
Figure 29G:
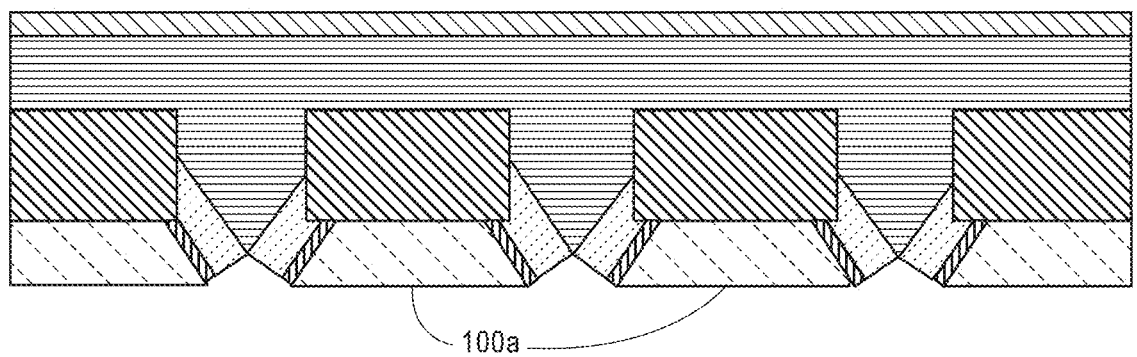
FIG. 29G shows a schematic cross-sectional view of a partially made device being made by the process illustrated by FIGS. 29A to 29J, according to an embodiment of the present disclosure.

Access holes 130 are then optionally formed, such as by etching, in the remaining portion of the thinned bulk portion 100c so as to expose the buried insulating layer 100b, as shown in FIG. 29F. An etching process is then carried out to completely remove the buried insulating layer 100b, which effectively also removes the remaining bulk layer 100c, as shown in FIG. 29G. As an example, where the buried insulating layer 108 is silicon dioxide, an HF wet etch process can be employed to selectively remove the buried oxide. Forming access holes 130 may not be necessary, but can potentially speed the removal of the buried insulating layer 108, since the undercut etch has to proceed only for the distance between the access holes, rather than all the way across the wafer.

Figure 29H:
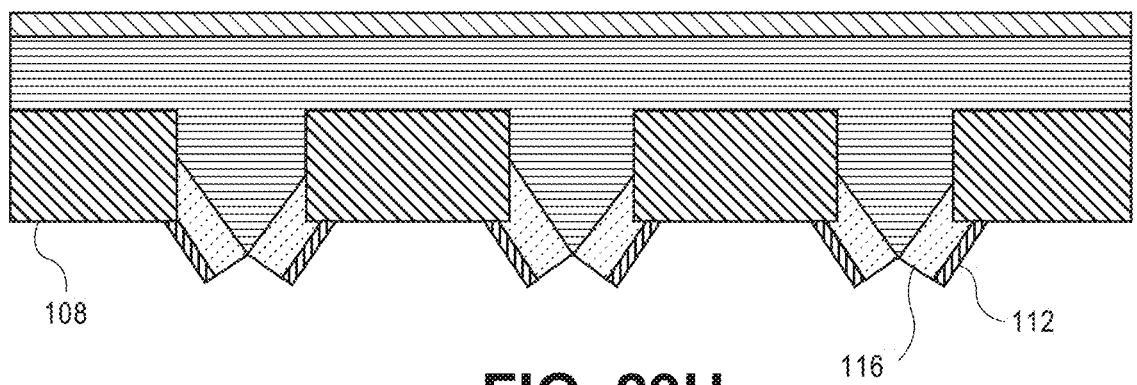
FIG. 29H shows a schematic cross-sectional view of a partially made device being made by the process illustrated by FIGS. 29A to 29J, according to an embodiment of the present disclosure.

Referring to FIGS. 29G and 29H, the remaining portions of the silicon layer 100a can then selectively be removed by a suitable etching process. Any suitable etch processes that can selectively remove the remaining device layer (which is e.g., silicon) without harming the III-V compound semiconductor material 114 can be used. For example, dry or wet etches can be employed, such as a reactive ion etch or a HNA wet etch, where the HNA is mixture of hydrofluoric acid, nitric acid, and acetic acid. Other possibilities include using $XeF_2$ or a F-containing plasma process. Group III-nitride materials, such as GaN, are impervious to these etch chemistries and so should not be harmed. Removing the silicon can allow for a reduction in light absorption at the emission wavelengths of various devices made using this process. Thus, the methods taught herein of removing silicon or any other light absorbing substrate materials can provide for improved c- or h-III-N optical devices.

The remaining structure shown in FIG. 29H is the epitaxial grown compound semiconductor without the substrate (e.g., the silicon-on-insulator substrate). The epitaxially grown structures can be in the form of stripes, as described herein. If desired, the removal process can be stopped at this point and the remaining structure can be employed for fabricating a desired device. In one such embodiment, the hexagonal crystalline material 116 is not removed. The cubic crystalline phase structure has a length dimension, a width dimension and a height dimension, the width dimension decreasing with the height so that the structure is tapered. The hexagonal crystalline material is formed adjacent to the tapered structure.

Figure 29I:
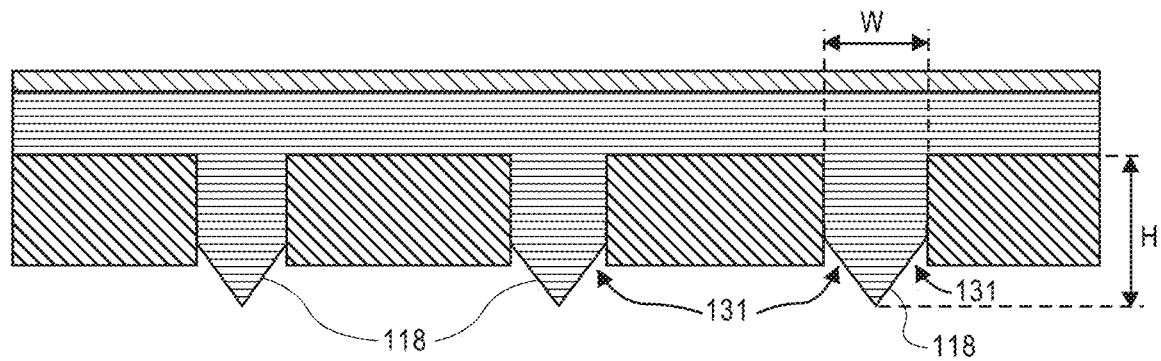
FIG. 29I shows a schematic cross-sectional view of a partially made device being made by the process illustrated by FIGS. 29A to 29J, according to an embodiment of the present disclosure.

Alternatively, buffer layer 112 and/or hexagonal crystalline phase layers 116 can be removed using, for example, a reactive ion or wet etch, so that only the cubic phase portion of the epitaxially grown semiconductor material 114 remains, as shown in FIG. 29I. An example of an etch process that may selectively remove the hexagonal material relative to the cubic structure is a KOH etchant, (e.g., a photoresist developer solution having a weak KOH concentration).

After the hexagonal crystalline material is removed, the cubic crystalline phase structure 118 has a length dimension, a width dimension and a height dimension. In the holes in the insulating layer 108, the width dimension decreases with at least a portion of the height so that the structure is tapered. Gaps 131 are formed adjacent to the tapered structure.

As discussed above, the method may optionally comprise doping the hexagonal crystalline material 116 and/or the cubic crystalline material 118 with a dopant chosen from an n-type dopant and a p-type dopant. The doping can occur during growth of the hexagonal and cubic crystalline phase structures or subsequent to growth, such as by using an ion implantation step or any other suitable doping technique. Examples of such doping techniques are well known in the art.

Figure 29J:
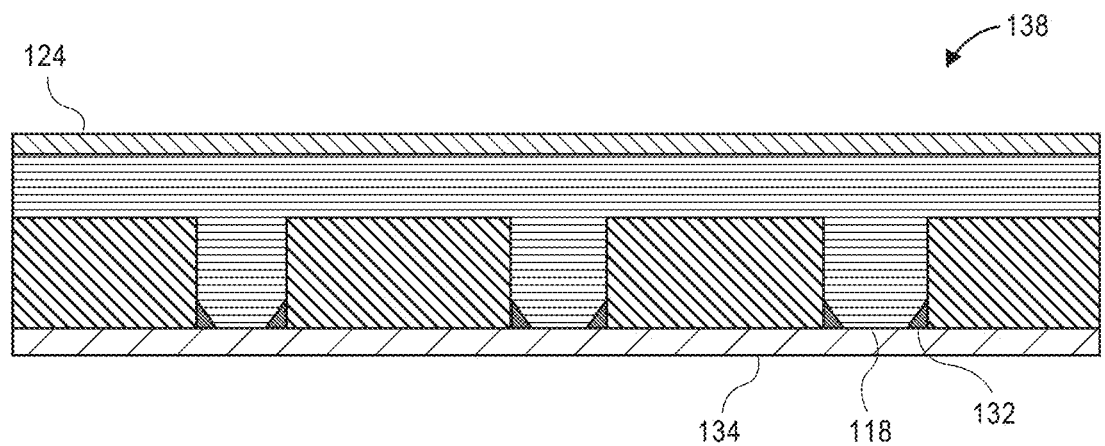
FIG. 29J shows a schematic cross-sectional view of a partially made device being made by the process illustrated by FIGS. 29A to 29J, according to an embodiment of the present disclosure.

In an embodiment, a filler material 132 is applied to fill gaps left by removal of the hexagonal crystalline phase layers 116 between the insulating layer 108 and the remaining cubic crystalline phase structure 118, so as to aid in providing encapsulation and/or mechanical strength. The gaps can be adjacent the remaining tapered portion of the crystalline phase structure 118. Filler material 132 can be any suitable insulating material, such as dielectric material that could include, for example, $SiO_2$ (such as TEOS) or polymers such as, benzocyclobutene (BCB), which is generally well known in the art as a dielectric for use in microelectronics. Still other oxide or polymer materials could also be used as filler. A polishing process can then be carried out to planarize the surface and optionally remove a portion of the cubic crystalline phase structure 118 and/or the filler material 132, as shown in FIG. 29J.

To provide electrical contact to the device being formed, such as for forming superluminescent diodes, LEDs or other optical devices, a second contact layer 134 is then deposited. The second contact layer 134 can be continuous or patterned, similar to the first contact layer 124. The first contact layer 124 and second contact layer 134 together provide for electrical contact with a semiconductor device comprising the cubic crystalline phase structure. In an embodiment, one or both of the first contact layer 124 and second contact layer 134 are transparent. For LEDs, transparent contacts have the advantage of allowing light to exit the device. In an embodiment, at least second contact layer 134 is transparent. In addition or instead of second contact layer 134 being transparent, the contact 124 and handle substrate 126 can be transparent to allow light to exit the backside of the wafer. Any suitable transparent contact material can be employed for contacts 124 and 134, such as indium tin oxide ("ITO") or other transparent materials known in the art. In an embodiment where light is to exit through the backside contact 124, one or more additional layers and/or the contact material 134 can be chosen to act as a mirror for light generated inside the semiconductor. This can help to control the direction of light emission. Choosing suitable additional layers and/or process steps to add to provide a mirror is within the ordinary skill of the art. After the contacts are formed, one or more additional layers (not shown) can be deposited to provide improved heat transfer for removing heat from the device and/or to provide encapsulation, as is well known in the art.

An embodiment of the present disclosure is also directed to a light emitting diode device. Referring to FIG. 29J, the light emitting diode 138 comprises a substrate comprising a Group III/V compound semiconductor material having a cubic crystalline phase. One or more n-type layers, p-type layers, blocking layers and/or an active region comprising, for example, one or more quantum wells, are positioned in the cubic crystalline phase. The layers and active region can be arranged as described with respect to FIG. 29D, as an example. In an embodiment, the active region of the device includes multiple quantum wells, such as the multi-quantum well ("MQW") devices of FIGS. 8B, 11B and 15B. A first metal contact 124 and a second metal contact 134 are positioned to provide electrical connectivity to the light emitting diode 138. At least one of the first and second metal contacts 124, 134 are transparent to visible light. The metal contacts 124 and/or 134 can optionally be patterned, such as shown by patterned contacts 136 of FIG. 29K.

In an embodiment, the light emitting diode 138 is not attached to a substrate comprising a Group IV semiconductor material, such as substrate 100. The cubic crystalline phase structure has a length dimension, a width dimension and a height dimension, the width dimension decreasing with the height so that the structure is tapered. In an embodiment, the hexagonal crystalline material 116 is not positioned adjacent to the tapered structure (e.g., such as where hexagonal crystalline material 116 is removed as described herein with respect to FIGS. 29H to 29I). In an alternative embodiment, all or a portion of the hexagonal crystalline phase 116, as shown in FIG. 29H, may remain as part of the final device 138. For example, the hexagonal crystalline phase 116 could replace filler material 132 in FIG. 29J.

Figure 29K:
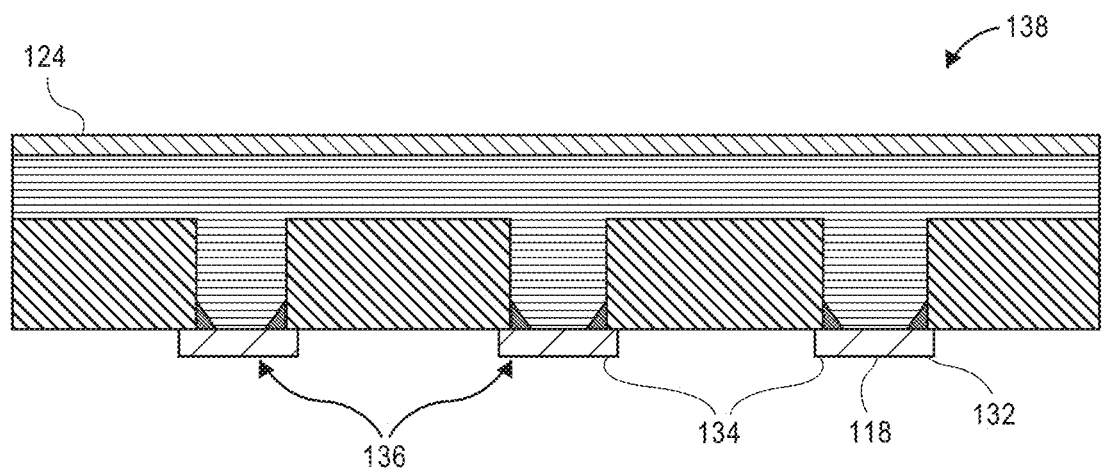
FIG. 29K shows a schematic cross-sectional view of a partially made device being made by the process illustrated by FIGS. 29A to 29K, according to an embodiment of the present disclosure.
Figure 29L:
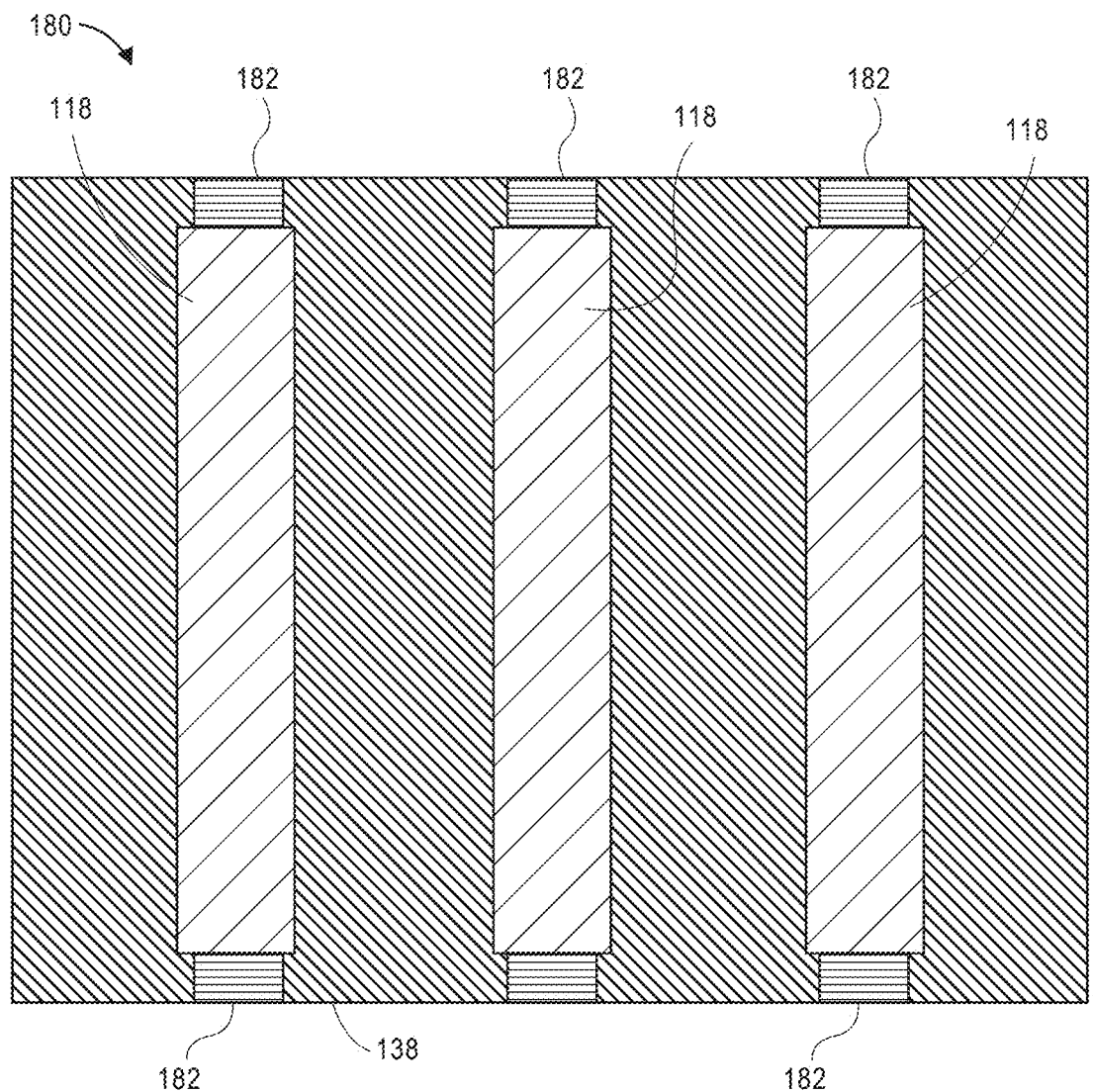
FIG. 29L shows a schematic cross-sectional view of a partially made device being made by the process illustrated by FIGS. 29A to 29L, according to an embodiment of the present disclosure.

An embodiment of the present disclosure is also directed to a laser diode device 180, as illustrated in FIG. 29L. FIG. 29L shows a schematic cross-sectional view of a device that is similar to the device 138 of FIG. 29K, where the device is configured as a laser diode as described below. Laser diode device 180 comprises two mirrors 182 separated by a gain length to form a cavity. The cavity comprises any of the cubic crystalline material 118 of the present disclosure, such as GaN, that is formed in stripes, as described herein. The mirrors 182 can be formed by cleaving the semiconductor material or alternatively by etching the cubic crystalline material stripe. It is advantageous for the laser diode device 180 to design the dimensions of the GaN material so that only one, or at most a few, transverse modes propagating along the stripe are supported in the final structure. This assures a strong overlap between the gain and the propagating modes. The starting material for the laser can either be the individual GaN stripes of FIG. 29D or the overgrown GaN regions of FIG. 29C. The removal of the Si substrate 100c, the SiO$_2$ layer 100b and single crystal silicon 100a, as well as the hexagonal crystalline material 116 and buffer layer 112 can follow the same process sequence as described with respect to FIGS. 29E through 29I. In an embodiment, absorption loss for the laser diode device 180 that is due to the metal contacts may be reduced by any suitable technique, such as growing additional material that allows the metal of the contacts to be positioned further from the active modal region, although this may allow additional modes to propagate, thereby reducing the effective gain. Accordingly, it may be desirable to design and position the contacts to balance both the reduction in gain and absorption loss associated therewith.

Figure 29M:
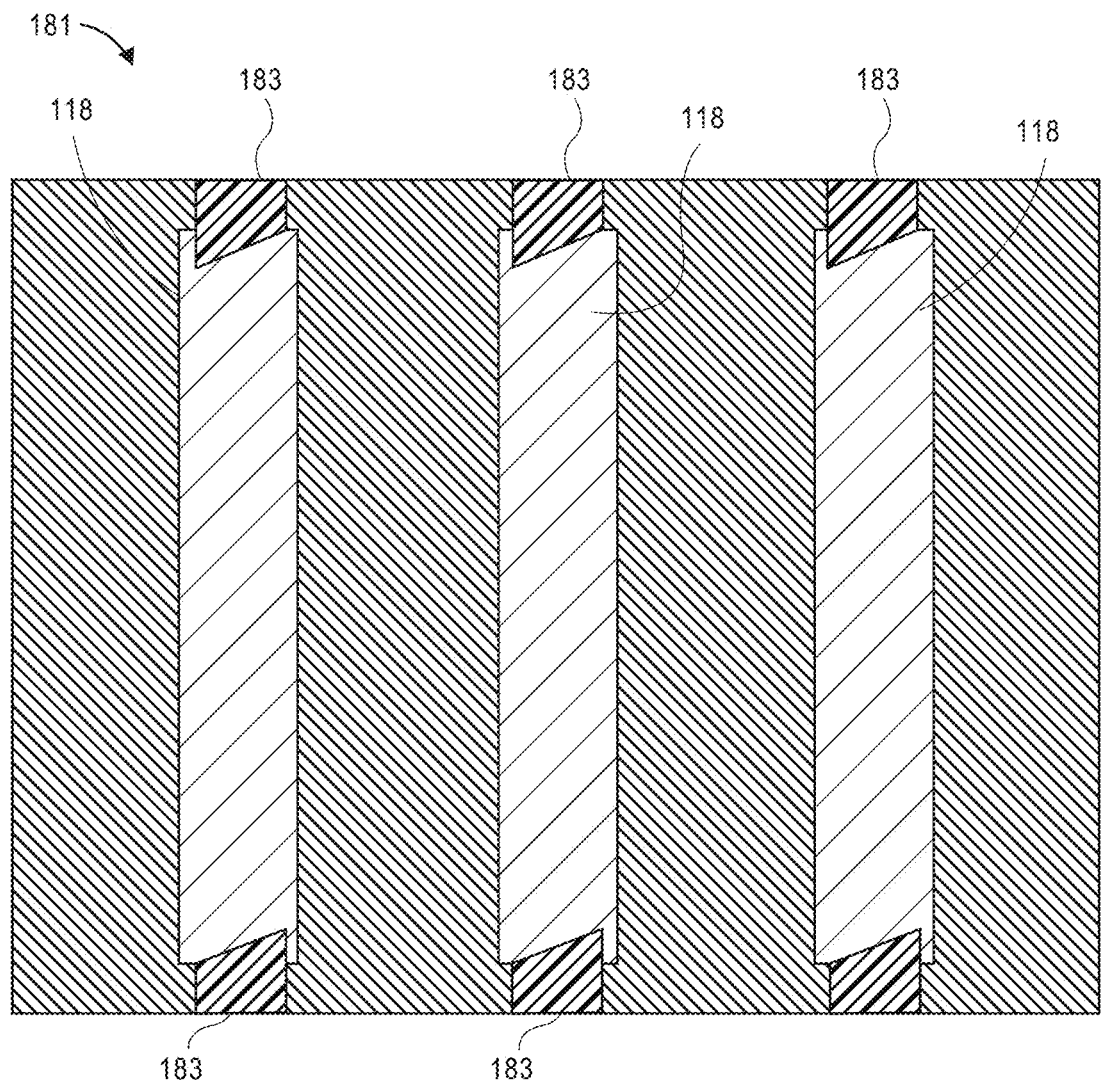
FIG. 29M shows a schematic cross-sectional view of a partially made device being made by the process illustrated by FIGS. 29A to 29K, and 29M according to an embodiment of the present disclosure.

An embodiment of the present disclosure is also directed to a superluminescent light emitting device (SLED) 181, which is similar to the device of FIGS. 29K and 29L as described above, except that the cavity mirrors 183 are deliberately tilted to form a non-perpendicular angle relative to the longitudinal direction of the stripe of cubic crystalline material 118, as shown for example in FIG. 29M. The particular tilt of the mirrors in FIG. 29M is for illustrate purposes only and the mirrors can be tilted in any suitable manner to provide the desired functionality of the SLED device. Further, mirrors 183 can be formed by any suitable method, such as etching the stripe of cubic crystalline material 118. One of ordinary skill in the art would readily be able to determine a suitable design and techniques for forming the mirrors 183 given the knowledge available in the art and the present disclosure. The cavity comprises any of the cubic crystalline material 118 of the present disclosure, such as GaN, that is formed in stripes, as described herein. It is advantageous for the SLED device to design the dimensions of the stripe of cubic crystalline material 118 so that only few transverse modes propagating along the stripe are supported in the final structure. This assures a strong overlap between the gain and the propagating modes. The starting material for the laser can either be the individual stripes of cubic crystalline material 118 of FIG. 29D or the overgrown cubic crystalline material 118 regions of FIG. 29C. If employed, the overgrown cubic crystalline material 118 regions of FIG. 29C may be patterned to form stripes using any suitable techniques, such as photolithographic and etching techniques that are well known in the art. The removal of the Si substrate, the SiO$_2$ layer and the hexagonal crystalline material 116 can follow the same process sequence as described herein with respect to FIGS. 29E through 29I. In an embodiment, absorption loss due to the metal contacts may be reduced by any suitable technique, such as growing additional material that allows the metal of the contacts to be further from the active modal region, although this may allow additional modes to propagate, thereby reducing the effective gain. Accordingly, it may be desirable to design and position the contacts to balance both the reduction in gain and absorption loss associated therewith.

Figure 31A:
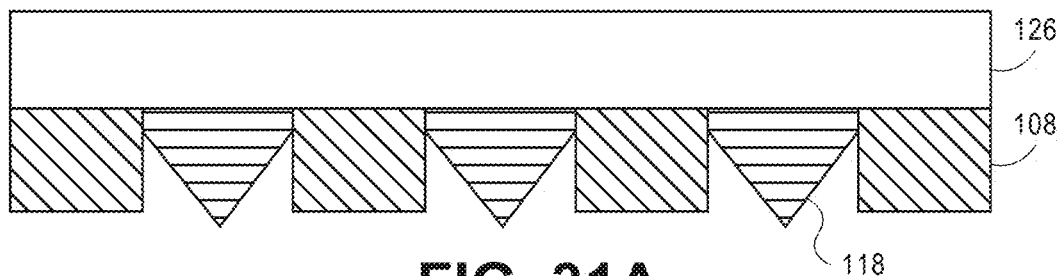
FIG. 31A shows a schematic cross-sectional view of a partially made device being made by the process illustrated by FIGS. 31A to 31C, according to an embodiment of the present disclosure.
Figure 31B:
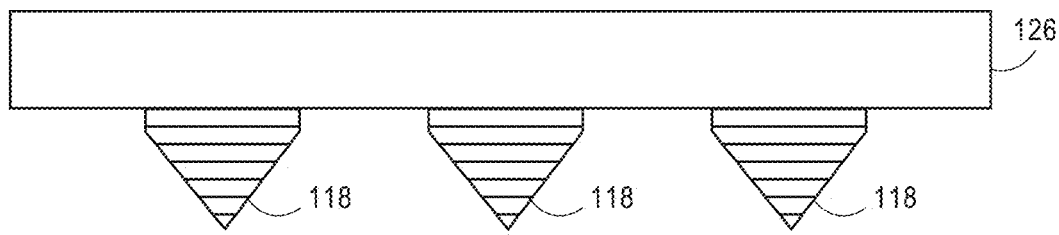
FIG. 31B shows a schematic cross-sectional view of a partially made device being made by the process illustrated by FIGS. 31A to 31C, according to an embodiment of the present disclosure.
Figure 31C:
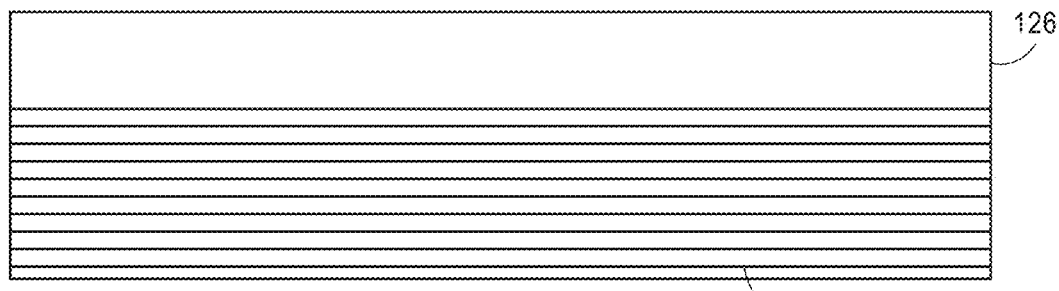
FIG. 31C shows a schematic cross-sectional view of a partially made device being made by the process illustrated by FIGS. 31A to 31C, according to an embodiment of the present disclosure.

An alternative process is illustrated in FIGS. 31A to 31C. The structure shown in FIG. 31A can be formed by any suitable method described herein, such as by the process described above with reference to FIGS. 29A to 29I, except that a backside contact is not formed and doped layers, quantum wells and/or p-n junctions may or may not be formed in the cubic crystalline phase structure 118. In an embodiment, only one polarity (e.g., n-type or p-type) of cubic crystalline phase III-V material is formed at the stage of stopping the localized epitaxial growth, so that the cubic crystalline phase structure 118 has only a single majority dopant type (n-type or p-type). Further, as shown in FIG. 31A, a second substrate 126 is attached to the cubic crystalline phase structure 118 and insulating layer 108 during the manufacturing process, as described herein above. As an example, the second substrate 126 can be attached to the cubic crystalline phase structure 118 prior to removal of the substrate 100. As shown in FIG. 31A, the substrate 100, buffer layer 112 and hexagonal crystalline phase structure 116 have all been removed using the same processes as described in connection with FIGS. 29C to 29I.

Referring to FIG. 31B, insulating layer 108 is also removed. Insulating layer 108 can be removed by any suitable selective etch process. Optional cleaning processes can be carried out to prepare the substrate for epitaxial growth. Epitaxial growth can then be carried out using the cubic crystalline phase structures 118 as seeds. During epitaxial regrowth, the cubic crystalline phase structures 118 coalesce into a cubic crystalline III/V continuous film 118', as shown in FIG. 31C.

In an embodiment, a doped layer(s), quantum wells and/or p-n junctions are formed in the cubic crystalline phase structure 118' during epitaxial growth thereof. For example, after coalescing the localized cubic crystalline phase structures into a continuous film, then device layers, including n- and p-doped layers and the gain material (e.g., quantum wells, such as InGaN quantum wells) can be formed by techniques known in the art.

In an embodiment, the Group III/V compound semiconductor material employed in the methods and devices described herein, including those of FIGS. 29A-29M, 30A-30B, 31A-31C, and 32-33, can be any of the Group III/V materials disclosed herein. In an embodiment, the Group III/V material is a Group III-nitride compound semiconductor material, such as any of the Group III-nitrides mentioned in the present disclosure. As an example, both hexagonal and cubic gallium nitride (GaN), hexagonal and cubic Indium Gallium Nitride (InGaN) or hexagonal and cubic aluminum gallium nitride (AlGaN) can be grown within the patterned grooves 106. Such growth processes are described in S. C. Lee et al., Appl. Phys. Lett. 84, 2079 (2004), the disclosure of which is incorporated herein by reference in its entirety. As an example, the epitaxially grown semiconductor material comprises a c-GaN region and optionally a h-GaN region, as described herein. In another example, the epitaxially grown semiconductor material comprises c-$In_yGa_{1-y}N$, where y is greater than 0 and equal to or less than 1.

An embodiment of the present disclosure is directed to an intermediate product semiconductor structure, as shown and described herein with respect to FIG. 29B. The intermediate product semiconductor structure comprises a substrate 100, which can be any of the substrates described herein. Substrate 100 comprises a major front surface 102, a major backside surface 104 opposing the major front surface, and a groove 106 positioned in the major front surface 102. A buffer layer 112 is disposed in the groove 106. An epitaxially grown semiconductor material 114 is disposed over the buffer layer 112 and in the groove. The epitaxially grown semiconductor material 114 comprises a hexagonal crystalline phase layer 116 and a cubic crystalline phase structure 118 disposed over the hexagonal crystalline phase layer.

In an embodiment, groove 106 is a v-groove. In yet another embodiment, groove 106 is a truncated v-groove comprising a first diagonal sidewall 106a, a second diagonal sidewall 106b opposing the first diagonal sidewall, and a bottom portion 106c that is parallel with the major front surface 102 of the substrate 100. The dimensions of the v-groove can be any suitable dimensions, as discussed herein. As an example, the V-groove has a width measured in a plane of the major front surface, the width of the v-groove being less than 10 micrometers.

In an embodiment, the substrate 100 is a silicon or silicon-on-insulator substrate comprising (001) single crystal silicon, the major front surface 102 and the bottom portion of the groove 106c both having a {001} crystal face, the first diagonal sidewall 106a and the second diagonal sidewall 106b both having a {111} crystal face. In an alternative embodiment, the silicon-on-insulator substrate comprises a (001) single crystal silicon layer 100a formed on an insulating layer 100b, the major front surface 102 of the substrate having a {001} crystal face, the first diagonal sidewall 106a and the second diagonal sidewall 106b both having a {111} crystal face, and the bottom portion 106c of the groove comprising a portion of the insulating layer 100b.

As described herein above, the semiconductor structure further comprises an insulating layer 108 formed on the major front surface of the substrate 100. Any suitable insulating layer can be employed, including silicon oxide, such as silicon dioxide, formed by any desired method.

In an embodiment in which a truncated v-groove 106 is employed a gap 120 is formed between the hexagonal crystalline phase layers 116 and the bottom portion of the v-groove 106c, as also described herein. The gap 120 can be filled with any suitable material. For example, all or at least a portion of the gap 120 can be filled with a gas. In yet another embodiment, at least a portion of the gap 120 is filled with a buffer layer material.

EXAMPLES

Example 1

A line array of v-grooves with a period of 1.8 microns was fabricated into a Si(001) substrate by interferometric lithography with a single longitudinal transverse mode, frequency-tripled, yttrium aluminum garnet laser at a wavelength of 355-nm and anisotropic wet etching based on potassium hydroxide. The lithographic pattern was aligned so that the v-grooves were aligned approximately along the <110> direction of the Si surface. This led to the revealing of {111} sidewalls after KOH etching. As a substrate, boron-doped Si(001) wafers with resistivity of ~10 ohm-cm were used. An electron beam-deposited Cr film (~200 nm) was employed as an etch mask. Each groove comprises two {111}-type facets forming a v-shape valley when viewed in cross section. The groove width was kept at ~0.8 microns and the corresponding depth was then ~0.6 microns.

On the v-groove-patterned substrate, a buffer comprising a thin AlN and 450 nm-thick GaN layer was grown first by MOVPE. The thin AlN was employed to avoid any nitridation on the Si surface at the beginning of deposition.

Example 2

On a patterned substrate similar to that of Example 1, an additional 5 stacks of a ~3 nm-thick $In_xGa_{1-x}N$ well with a ~20 nm-thick GaN spacer, and an ~8 nm-thick GaN capping layer were consecutively grown on the 450-nm-thick GaN buffer layer. All layer thicknesses, both in Example 1 and Example 2, were calibrated on a sapphire (0001) plane as a reference. The total amount of deposition was sufficient to induce the phase transition to cubic phase by filling up each v-groove. At the same time, the deposition was controlled to avoid any coalescence between the epitaxial layers grown on adjacent grooves. Thus, most of the epitaxial layers grown on individual grooves kept the identical crystal shape even when growing beyond their initial filling of their respective groove.

Example 3

Figure 2A:
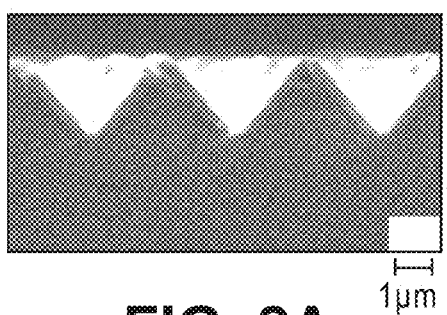
FIG. 2A shows an example of a buffer layer, according to an embodiment of the present disclosure.
Figure 2B:
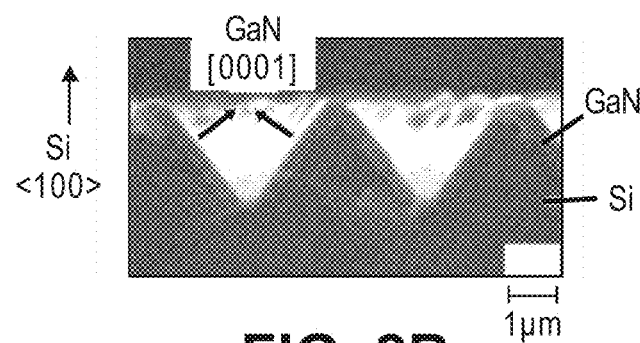
FIG. 2B shows an example of a buffer layer, according to an embodiment of the present disclosure.

Examples of different buffer layers are shown in FIG. 2. In FIG. 2B the nucleation layer is about 25% thinner than in FIG. 2A. The resulting growth looks similar in both cases, showing good and selective nucleation normal to {111} planes. In the example of FIG. 2, no growth occurred on the flat top Si (100) surfaces between the v-grooves. The GaN on the sidewalls was smooth and continuous, but the top edges were irregularly shaped. Voids can form where the two wings from adjacent v-grooves join.

Example 4

Figure 3A:
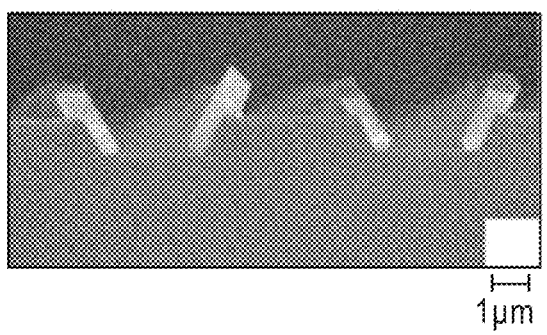
FIG. 3A shows growth of a buffer layer on a patterned substrate, according to embodiments of the present disclosure.
Figure 3B:
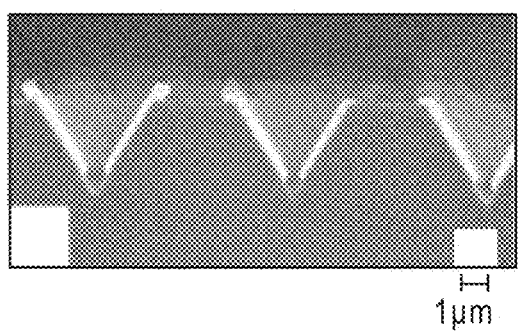
FIG. 3B shows growth of a buffer layer on a different substrate pattern compared to that of FIG. 3A, according to embodiments of the present disclosure.

The effect of different substrate patterns was studied in wide grooves with flat bottoms and sharp v grooves, as shown in FIG. 3. In FIG. 3A, illustrating grooves with relatively wide spacing between the sidewalls, the GaN was thicker than in 3B, indicating that due to the reduced nucleation area, the growth rate increases. This is a well-known effect in selective area growth. The GaN thickness is 510 nm and 380 nm in FIGS. 3A and 3B, respectively.

Figure 4:
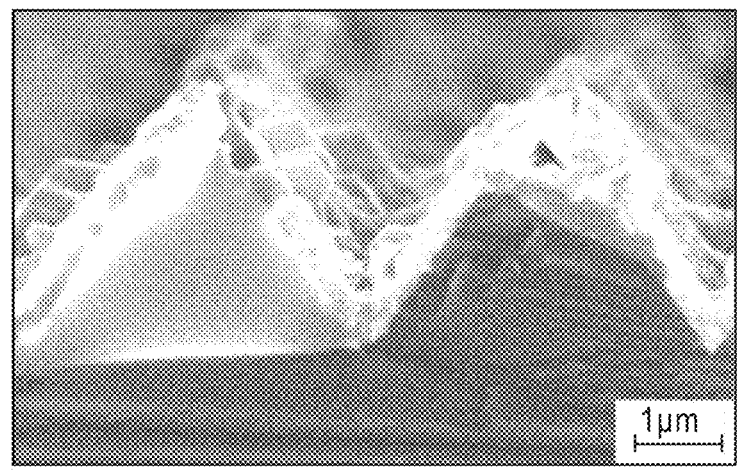
FIG. 4 shows a result of a 30 min GaN growth, which resulted in irregular GaN growth and alloying problems.
Figure 5A:
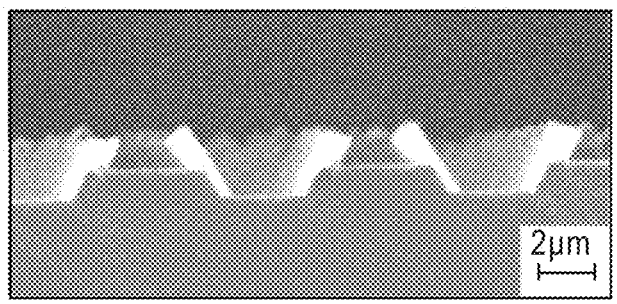
FIGS. 5A and 5B show a thicker AlN buffer layer that reduced or eliminated the alloying problem shown in FIG. 4, according to an embodiment of the present disclosure.
Figure 5B:
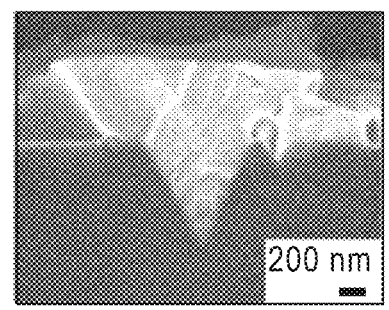

To merge the two growth fronts from the two sidewalls, longer growth times can be employed. In FIG. 4 the result of a 30 min GaN growth is shown. FIG. 4 shows irregular GaN growth and alloying problem due to increased growth time. The crystal quality was degraded and some parts of the structure show the alloying problem discussed above. A thicker AlN buffer, as shown in FIG. 5A, eliminated the alloying problem, as can be seen in FIG. 5B.

From the above example, the following can be concluded. For successful growth, the thickness of the AlN nucleation layer can be varied to prevent or reduce the alloying problem. For long growth times this alone may not be enough and a combination of low GaN growth temperature and AlGaN interlayer can be employed. The use of the AlGaN interlayer is a trade-off between selectivity and prevention of alloying.

Example 5

Figure 6A:
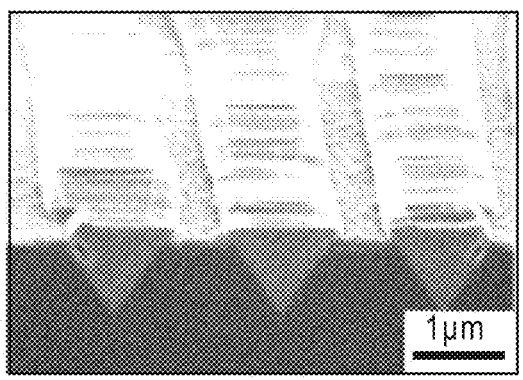
FIG. 6A shows an example of structures grown after the optimization of nucleation and buffer layers.
Figure 6B:
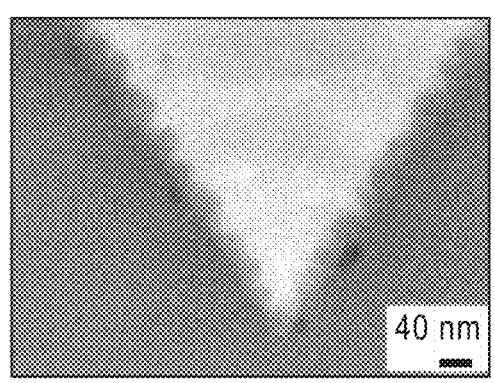
FIG. 6B shows an example of structures grown after the optimization of nucleation and buffer layers.

An example of structures grown after the optimization of the nucleation and buffer layers is shown in FIG. 6. The structure is uniform on the scale of several $mm^2$, and the SEM images reveal that the two growth fronts in the grooves merged completely. The top surface in the center region is not completely smooth, but shows steps and striations. The top surface of GaN near the sidewalls is angled away from the horizontal and it shows a slightly smoother morphology than the center region. The v-groove depth was on the order of 0.7 μm and the GaN thickness between the v-shaped contrast line and the silicon was around 0.2 μm (measured perpendicular to the Si {111} sidewalls).

To prepare for the growth of a MQW structure, an undoped cubic GaN template was grown and its quality verified. It was observed that the AlN nucleation layer and the AlGaN layers interacted during growth and sharp tips of presumably AlGaN protruded into the AlN layer. Despite this, alloying was not a problem for this structure. This structure was subsequently used to regrow a cyan MQW structure. The MQW comprises 7 pairs of GaInN/GaN layers. The equivalent super-lattice period for one pair in a planar layer is 25.2 nm. An optical microscope image in Nomarski mode and a PL image are shown in FIG. 8. It was found that after the regrowth some areas show very smooth surface morphology, and most of the GaN stripes in the other areas are rough on a micrometer scale. The roughness comes from parasitic growth on the GaN stripes, which produces hillocks. Between these defects, smooth, micron-sized regions can be found along the GaN stripes.

Figure 7A:
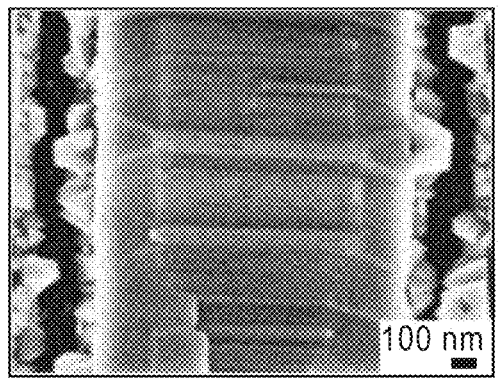
FIG. 7A shows a top-view image with striations in the central part of the V-groove and perpendicular to the V-groove direction.
Figure 7B:
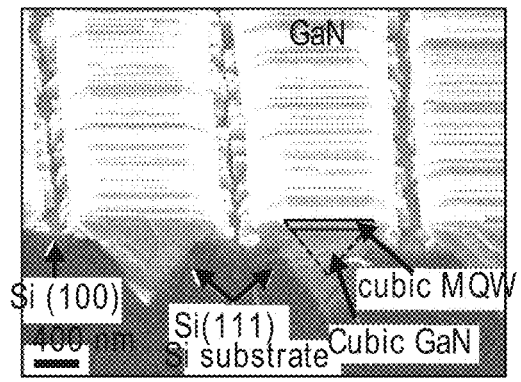
FIG. 7B shows a birds-eye-view of a cross-section of a regrown sample.

FIGS. 7A and 7B show SEM micrographs of the regrown cyan MQW structure. FIG. 7A shows a top-view image showing striations in the central part perpendicular to V-groove direction. These striations extended to the sloped sidewall regions. The arrows mark the total width (1.3 μm) and central region width (0.9 μm). FIG. 7B shows a birds-eye-view of a cross-section of the regrown sample. The annotations identify the different regions. From FIG. 7 it is evident that the morphology of the re-grown MQW conformed to the template structure. The striations on the top surface were more pronounced and also the polycrystalline growth between the adjacent stripes had increased. The width of the central region in FIG. 7A was 0.9 μm, whereas the total width of the GaN stripe was 1.4 μm. The (tilted) cross-section view in FIG. 7B shows the uniform growth in several grooves. It is observed that after the MQW regrowth the GaN protruded above the silicon surface, and for the most part, the structure above the Si surface was similar to that inside the groove. Only a slight lateral overgrowth was visible, starting from the sidewalls and extending over the region between adjacent stripes.

It was possible to observe the contrast of the MQWs in SEM micrographs due to the combined effect of different atomic composition of GaN and GaInN layers and different fracturing of the layers during cleaving. FIG. 8A shows the cross-section of an individual GaN stripe (with enhanced contrast for clarity). As shown, a large V-shaped contrast separated the sidewalls from the central region. Several layers can be seen near the top surface. These layers were the re-grown MQWs and they conformed to the shape determined by the template structure. It was evident that the MQWs grew parallel to the top surface in the central region and they were inclined away from the horizontal on the sidewall top surfaces. In addition, they also grew on the (inclined) vertical sidewalls. The growth rate in this direction was strongly reduced, as evident from the drastically reduced spacing between the MQWs (see FIG. 8 B)).

Example 6

Figure 9:
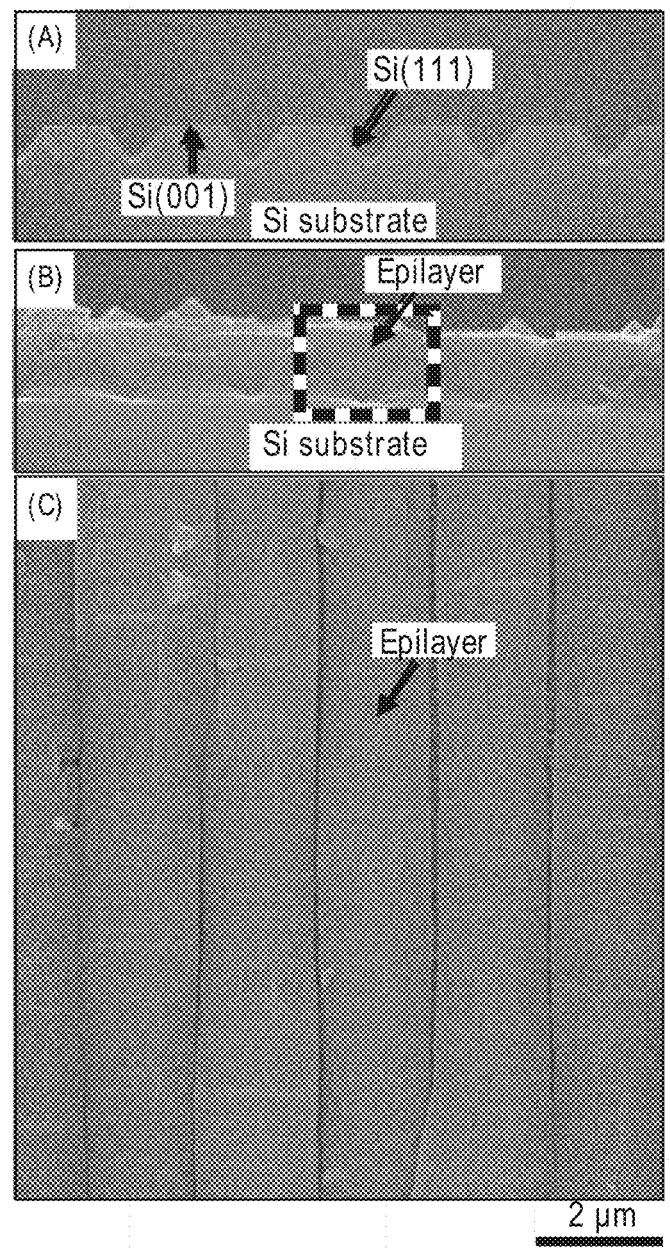
FIGS. 9A, 9B, and 9C are scanning electron microscope (SEM) images of example groove cross-sections.

FIGS. 9A, 9B, and 9C are cross-section SEM images. FIG. 9A shows an array of v-grooves fabricated into a Si(001) substrate. FIG. 9B is an SEM image of the cross section of the epitaxial layers grown on the grooves in FIG.

9A with a planar top surface. FIG. 9C reveals the surface morphology in top-down view that is slightly roughened by surface undulation along and some bumps near the edges of each stripe. The top transverse lateral dimension of each epitaxial layer extends up to ~1.5 microns.

Figure 10:
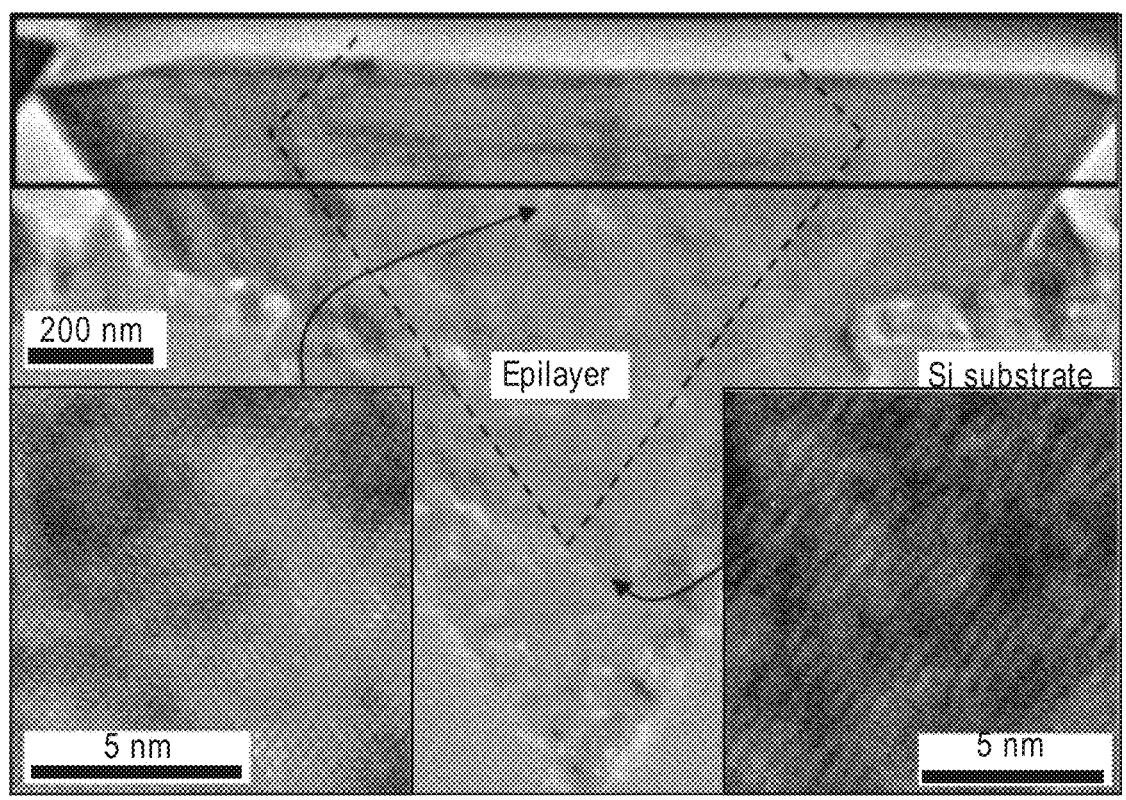
FIG. 10 shows a cross section tunneling electron microscope (TEM) image of the epilayers on a single v-groove corresponding to the dashed box in FIG. 9B.

FIG. 10 is a TEM image corresponding to the dashed box in FIG. 9B. The region above the dashed line corresponds to c-GaN and c-$In_xG_{1-x}$N layers. The insets show high resolution TEM images of the h-GaN buffer near the interface (right) and the c-GaN in the middle of the v-groove indicated by the arrows. The inset images confirm that h-GaN was grown at the initial stage of growth and changed to the cubic phase in the middle of the v-groove. Some possible explanations for the phase transformation have been proposed in our previous work. Also, the slight contrast difference along the dashed lines that match with the intersection points of different facets at the top surface clearly reveal the formation of different phase epitaxial layers. Thus, the region above the dashed line in FIG. 10 corresponds to c-GaN and c-$In_xGa_{1-x}$N.

Figure 11A:
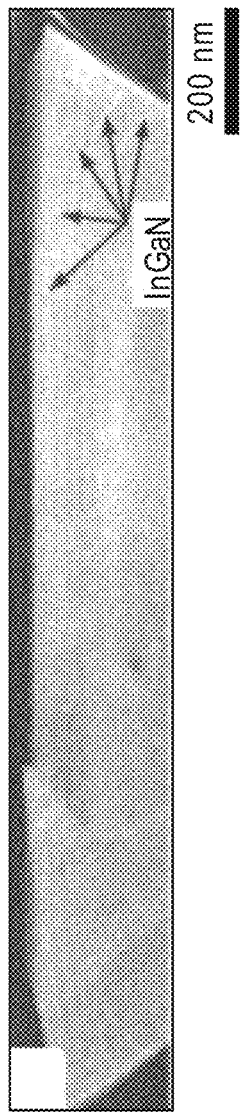
FIG. 11A shows a scanning tunneling electron microscope (STEM) image of the solid box in FIG. 10 revealing example $In_xGa_{1-x}N$/GaN MQWs.
Figure 11B:
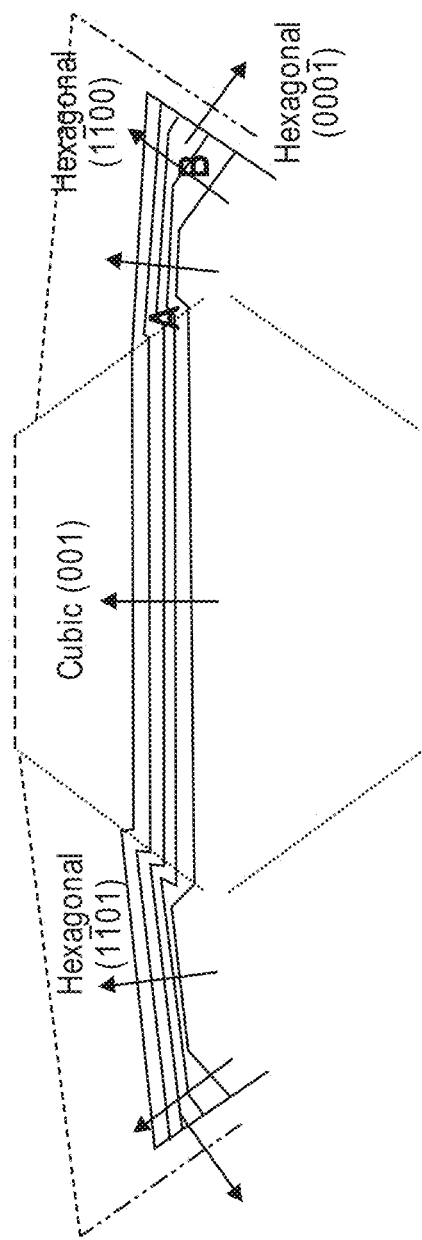
FIG. 11B is a crystal orientation map identified from the five $In_xGa_{1-x}N$ layers of FIG. 11A.

FIG. 11A shows a STEM image of the solid box in FIG. 10 revealing the $In_xGa_{1-x}$N/GaN MQWs. FIG. 11B is a crystal orientation map identified from the five $In_xGa_{1-x}$N layers in FIG. 11A. The five bright lines near the top surface in FIG. 11A correspond to the five $In_xGa_{1-x}$N QW layers and play a role of markers revealing the front growth surface faceting that evolves during epitaxy. As seen in FIG. 11B, the top surface comprises three major facets, cubic (001) at the center, and hexagonal (000$\bar{1}$) and {1$\bar{1}$01} near both edges. The c-$In_xGa_{1-x}$N is formed in the middle of the v-groove and laterally extends up to 1 μm over the groove. The c-GaN facets are nonpolar and free from the piezoelectric effects impacting the optical properties of III-N's. The dotted and the dashed lines represent real (below the solid line of the top surface) and imaginary (above the solid line of the top surface) cubic/hexagonal phase boundaries and the expected growth pattern for continued growth.

Figure 12A:
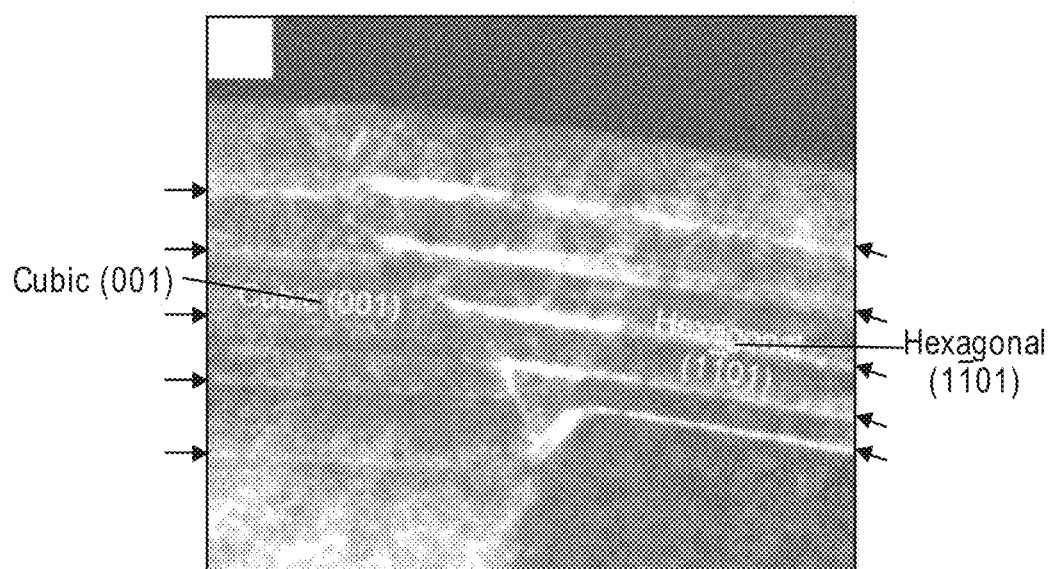
FIG. 12A presents the details of change in crystal shape through faceting at the front growth surface as revealed in FIG. 11A.
Figure 12B:
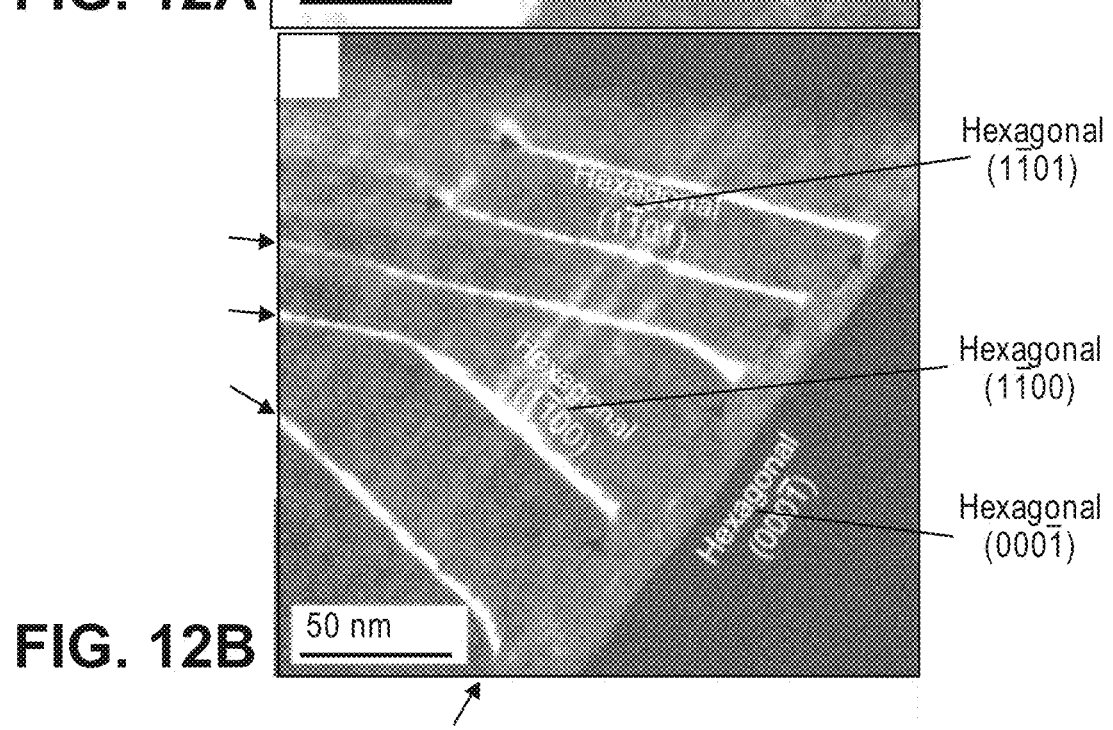
FIG. 12B present the details of change in crystal shape through faceting at the front growth surface as revealed in FIG. 11A.

FIGS. 12A and 12B present the details of the change in crystal shape through the faceting at the front growth surface as revealed in FIG. 11. While the crystal shape in FIGS. 10 and 11 is terminated only with three facets; as can be seen in FIG. 11B and FIG. 12B, at least four different facets were involved during growth. In particular, there was an additional {1$\bar{1}$00} facet from the hexagonal phase at both edges in addition to the three facets already identified. Based on the profile of the $In_xGa_{1-x}$N layers shown in FIG. 12, it can be noticed that these four facet orientations have very different growth rates and their unequal growth rates result in a layer-to-layer and facet-to-facet thickness variation of the $In_xGa_{1-x}$N wells, leading to the change in crystal shape. From the first GaN spacer (deposited atop the first $In_xGa_{1-x}$N QW layer) to the cap layer, the nominal deposition thickness is 100 nm. Then, the actual deposition thickness on each facet measured from FIG. 12 is:

$$t_{000\bar{1}}:t_{1\bar{1}01}:t_{001}:t_{1\bar{1}00} = \sim 23 \text{ nm}:\sim 83 \text{ nm}:\sim 107 \text{ nm}:\sim 230 \text{ nm}, \quad (1)$$

where $t_{1\bar{1}00}$ is the deposition thickness from the first GaN spacer to the third $In_xGa_{1-x}$N QW layer (i.e., two pairs of a GaN spacer and an $In_xGa_{1-x}$N QW) since the {1$\bar{1}$01} facet is no longer available at the fourth $In_xGa_{1-x}$N QW layer. In Equation (1), the thickness of the {000$\bar{1}$} layer is less than the nominal deposition thickness while the {1$\bar{1}$01}, (001) and {1$\bar{1}$00} thickness are greater than the nominal deposition thickness. Then, according to one example of the present disclosure and from Equation (1), the relative growth rates with respect to the growth rate of (0001) plane that depend on facet orientation can be approximately written as:

$$r_{1\bar{1}01}:r_{001}:r_{1\bar{1}00} = \sim 3.6:\sim 4.7:\sim 10 \quad (2)$$

Here, $r_x$ represents the relative growth rate of each facet normalized by that of the h-GaN (000$\bar{1}$). Thus, (000$\bar{1}$) is the lowest in growth rate while {1$\bar{1}$00} has the highest growth rate among the given facets. The {1$\bar{1}$00}-type facet and/or plane grows very fast but ultimately disappears from the growth front surface in continued epitaxy. Since the filling of individual grooves with h-GaN in [0001] as well as c-GaN in [001] preferentially proceeds at the initial stage of growth, it can be conjectured that the growth rate of (0001) should be considerably greater than that of (000$\bar{1}$) observed at the edge of each epilayer in Equation (1). That is, (000$\bar{1}$) and (0001) are very different in growth rate under the given conditions. Then, Equation (2) is consistent with reported data where the observed growth rates vary from lowest to highest along {1$\bar{1}$01}, {1$\bar{1}$00}, and (0001).

FIG. 12A shows magnifications of areas at the junction of (001) and {1$\bar{1}$00}. FIG. 12B reveals the disappearance of the {1$\bar{1}$00} facet near the right edge of the epilayer in FIG. 11. The arrows in each figure indicate $In_xGa_{1-x}$N layers on individual facets.

A surface analysis shows that (000$\bar{1}$) and (0001) are a Ga-terminated (gallided) and a N-terminated (nitrided) surface, respectively, and the gallided surface is energetically more stable than the nitrided surface for GaN. A more stable surface is less active in bonding adatoms for nucleation.

Regarding the cross section of the epilayer on each groove in FIG. 11A as a 2-dimensional crystal, the epitaxy proceeds with the minimization of total surface free energy at the given cross sectional area. This drives the shape of an epilayer to the equilibrium crystal shape (ECS) for the specific growth conditions. Assuming that every facet on the epilayer has the equal accessibility to the source gases supplied into an MOVPE reactor, and a lateral dimension less than or comparable to the adatom surface migration length, the lowest total surface free energy can be maintained at any stage of the epitaxy by contracting [expanding] the areas of higher [lower] surface energy facets (e.g., the lengths of a facet in the cross section of FIG. 11). This coincides with adatom migration across facet boundaries. In epitaxy, the contraction of a certain facet generally occurs when it has a faster growth rate than for adjacent facets (i.e., in-migration rate >out-migration rate) and as a result accompanies the area expansion of those neighboring facets of lower surface free energy. Then, the decreasing order of growth rate is roughly proportional to the energetic stability of the given facets and the significantly low growth rate on (000$\bar{1}$) in Equation (2) doesn't contradict the reported surface analysis. Equation (1) implies that surface free energy of (000$\bar{1}$) is the lowest of the other facets involved in the crystal shape of the epilayer. On the other hand, {1$\bar{1}$00} has the highest free surface energy. This means the adatoms on nearby (000$\bar{1}$) and {1$\bar{1}$01} in FIG. 11B migrate onto {1$\bar{1}$00} and some of them on {1$\bar{1}$01} also have nonzero out-migration rate into the adjacent (001). From FIGS. 11 and 12 it can be theorized that the crystal shape may evolve through the generation and annihilation of various facets by adatom migration that can be explained with ECS. It should be emphasized that the surface free energy is directly related to the surface reconstruction which is affected by growth conditions during epitaxy and the order of surface free energy deduced from Equation (1) is valid only under the given growth parameters.

As revealed by the $In_xGa_{1-x}N$ layers in FIG. 11, the top surface of c-GaN before the deposition of the first c-$In_xGa_{1-x}N$ layer is already flat. While some of the epilayers show noticeable fluctuation in planarization up to the 2nd $In_xGa_{1-x}N$ deposition, most of them attain the planar surface before deposition of $In_xGa_{1-x}N$ MQWs. Thus, at least three c-$In_xGa_{1-x}N$ QW layers from the top keep planar interface parallel to Si(001) across the cubic phase region. According to ECS based on the minimization of total surface free energy, however, $r_{001}$ greater than $r_{1\bar{1}01}$ in Equation (2) implies that the free surface energy of the c-GaN (001) facet is higher than that of the h-GaN $\{1\bar{1}01\}$ and this facet will ultimately vanish out from the front growth surface as epitaxy proceeds further. FIG. 11 also implies the annihilation of (001) in continued epitaxy, with the dashed lines representing an imaginary front growth surface that would be formed with continued epitaxy beyond the capping layer surface. Then, the resulting cross section would comprise a rhombus-shape c-GaN totally enclosed within h-GaN. This variation of cross section is very important in device applications of c-III-N's. In order to have the maximized cubic phase top (001) surface, the growth must be controlled to stop near the point where the cross section of the cubic phase attains the shape of a half of the rhombus in cross section, as in FIG. 10.

The single v-groove epilayer shown in FIG. 10 is composed of spatially separated, two phase materials exposing several different facets along a single top surface. A theoretical calculation suggests that critical thickness of $In_xGa_{1-x}N$ on GaN with In composition of ~0.2 is lower by up to 20% in hexagonal phase compared with the same constituent material in the cubic phase. Generally, nucleation depends on substrate orientation in the epitaxial growth of strained heterostructures. Moreover, the cubic (001) orientation has a different misfit stress than the neighboring hexagonal $\{1\bar{1}01\}$ and $\{1\bar{1}00\}$ facets. Previously, a higher tensile stress in c-GaN at the center region (~1 GPa) than in h-GaN near the edge (up to 0.5 GPa) has been reported over a deep sub-μm-scale v-groove.

Then, there could be a substantial issue on the nucleation of $In_xGa_{1-x}N$ in FIG. 10 and the In adatom migration due to the stress from the multiple facets on a h-surface as well as the coexistence of h- and c-GaN at the growth surface. A rigorous approach is beyond the scope of this work. However, FIG. 12 may provide a rough idea for the In incorporation on a multi-faceted front growth surface. First, Equation (2) can be applied to $In_xGa_{1-x}N$ QW layers to evaluate thicknesses over different facets. In FIG. 12(b), the ratio of the thickness on $\{1\bar{1}01\}$ to the thickness on $\{1\bar{1}00\}$ for $In_xGa_{1-x}N$ is not noticeably different from that for GaN. That is, h-$In_xGa_{1-x}N$ QWs on $\{1\bar{1}00\}$ are ~ twice wider than that on $\{1\bar{1}00\}$ in thickness. Then, there seems to be the mass transport of In adatoms across the facet boundary that is almost identical to that of Ga adatoms. If the adatom migration conjectured from Equation (2) is applied to the c-$In_xGa_{1-x}N$ QWs on (001), they are expected to be a little thicker than those on $\{1\bar{1}01\}$. But, this is not confirmed in FIG. 12A. On the contrary, they looked thinner than those of on $\{1\bar{1}01\}$ with lower contrast. This is opposite to the tendency observed in GaN spacers between (001) and $\{1\bar{1}01\}$ where growth on (001) catches up that on $\{1\bar{1}01\}$ as a result of the faster growth rate, as discussed earlier. It is not clear whether these observations are due to the stress near the junction of the two facets or some instrumental byproduct from the STEM image capture. Further study is required to understand the In incorporation onto cubic phase (001) plane bounded by hexagonal $\{1\bar{1}01\}$ and its correlation with stress resulting from lattice mismatch and spatial phase separation. Nonetheless, it is evident that the migration and nucleation of In adatoms are affected by the presence of the phase and facet boundaries at the growth front surface in $In_xGa_{1-x}N$ growth and as a result this impacts the optical and electrical properties of the c-$In_xGa_{1-x}N$/GaN MQWs.

Example 7: Photo- and Electro-Luminescence

Figure 13:
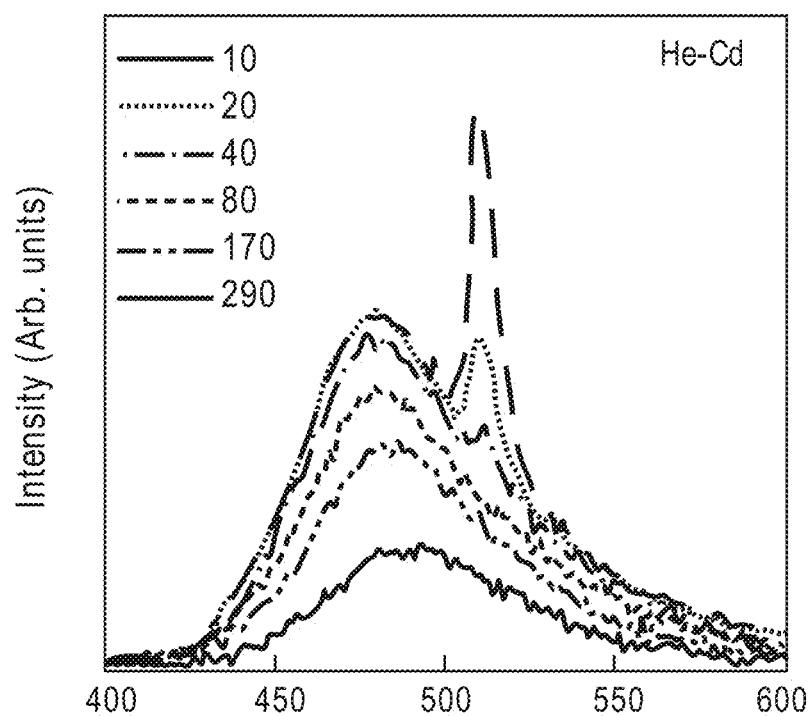
FIG. 13 presents PL spectra in the temperature range of 10-290 K obtained from example $In_xGa_{1-x}N$/GaN quantum wells.

FIG. 13 presents the PL spectra in the temperature range of 10-290 K obtained from $In_xGa_{1-x}N$/GaN quantum wells of the present disclosure, such as those in FIG. 12. At 290 K, a single broad peak is observed at a wavelength of 491.9 nm. This peak follows the temperature-dependent bandgap of GaN and shifts to 478.6 nm at 10 K. Another narrow peak at 510.1 nm is evident below 60 K. The narrow peak is strengthened and becomes comparable to the broad peak in intensity at 10 K. The investigation of the origin of the narrow peak is presently underway. Assuming that both peaks are from the MQWs, the range of In composition can be roughly estimated as 0.2-0.3 in the consideration of both hexagonal and cubic phase. As discussed earlier, STEM reveals the possibility that the spatial inhomogeneity of the In atoms within each QW layer and c-$In_xGa_{1-x}N$/GaN MQW could have the peak separation from h-MQWs that is less than the bandgap difference between c- and h-$In_xGa_{1-x}N$, as a result of both thickness and concentration variations, and this may impact the peak splitting and the linewidth broadening.

Example 8: LED Structures

Figure 14A:
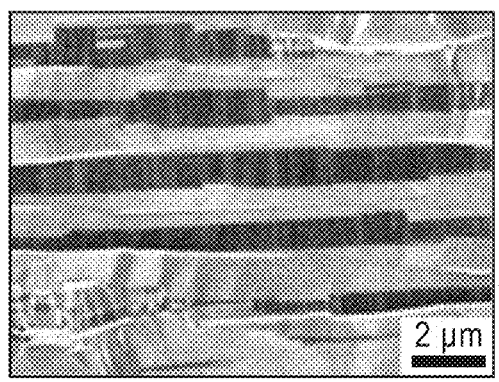
FIG. 14A shows an example of neighboring GaN stripes.
Figure 14B:
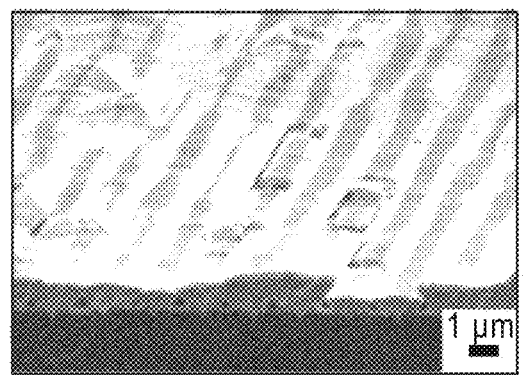
FIG. 14B shows an example of neighboring GaN stripes.

After these encouraging results on the MQW growth, full LED structures that include a final Mg-doped layer (200 nm thick) were grown. For this structure a substrate with small V-grooves was used. The depth of the initial grooves was 0.3 μm and the width at the top was 0.45 μm. From FIG. 14 it can be seen that after the growth, some portions of the neighboring GaN stripes touched each other. There was a significant density of hillocks on the GaN stripes. Between these defects continuous stripes with lengths in the tens of micrometers were found (FIG. 14A). FIG. 14A shows a strong contrast difference between the central region and the sidewalls. The stripes showed the familiar striations perpendicular to the groove direction, just like those observed in undoped GaN and the MQW structures. It was particularly interesting to find that the basic growth scheme continued even once the GaN had grown significantly out of the initial V-groove (FIG. 14B). The individual stripes showed some variation in height, and therefore even if merging of the cubic GaN regions of neighboring stripes were possible (for example using growth masks or etching), the height difference would make it difficult to achieve consistent crystal quality.

From the SEM cross-sections (FIG. 15A), the Mg-doped layer on top of the LED structures was clearly visible with its brighter contrast. This is also commonly observed in wurtzite LEDs on sapphire. A schematic of the structure is shown in FIG. 15B. The introduction of the Mg dopant did not change the growth properties significantly. There was little Mg-doped GaN on the sidewalls (facing adjacent grooves) since the GaN stripes almost touched each other before this layer was grown, and therefore little material could enter the gap between two adjacent stripes.

Example 9: Electrical and Optical Characteristics of Cubic GaN LEDs

Figure 19:
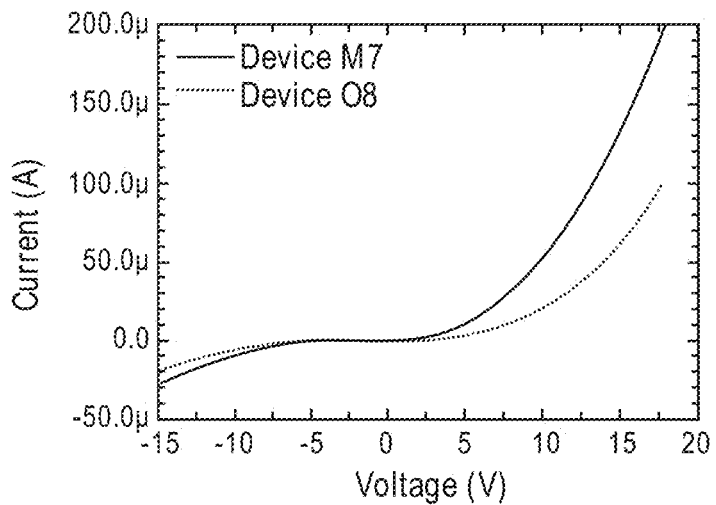
FIG. 19 shows a graph of data collected from several examples of the present disclosure.

The IV characteristics of two cubic GaN LEDs, which were made according to the methods of the present disclosure and that were similar to the device illustrated in FIG. 18, are shown in FIG. 19. These two LED devices were labeled as M7 and O8 in FIG. 19. The data for these device shows clear diode behavior with moderate leakage. The rectifying ratio of current in forward to current in reverse direction is as high as 4.8 at ±15V for the device labeled M7. Given the dimensions of the small p-side contacts, which have an area less than 1 μm², the calculated current density is on the order of tens of kA/cm². This would be an exceptionally high current density, and it is believed that not all current is flowing through this small contact, but instead is leaking through the contact pad. This is possible because the surface morphology is very rough and has sharp features, which can facilitate dielectric breakdown in the insulating layer. Additionally it was observed that the probing needle may slightly damage the contact pad, which could also add to parasitic leakage.

Relatively strong electroluminescence (EL) was observed for the two devices M7 and O8. The spectra data for the two cubic GaN LED devices M7 and O8 are shown in FIG. 20 and FIG. 21, respectively. In particular, FIG. 20 shows spectra of device M7 in FIG. 20A (linear) and FIG. 20B (semi-logarithmic) plots. FIG. 21 shows spectra of device M7 in 21A (linear) and 21B (semi-logarithmic plots).

The EL for other devices (not shown) showed parasitic bluish emission from directly under the probing needle or the corners of the probing pad. The parasitic emission was often flickering, whereas the emission from the region with intentionally fabricated contacts was stable. To quantify the emission characteristics, the light from the devices was collected by an optical fiber (400 μm silica core) positioned a few mm above the LED. The spectral sensitivity of the setup was calibrated indirectly using an intermediate light source. This resulted in small artifacts in the recorded spectra in the form of shoulders on the main peak. It must be noted that the absolute power calibration using this approach has a potential large error and therefore has to be regarded as an order-of-magnitude estimate.

The wavelength of the main peak in FIG. 20A is at 489 nm at a current of 140 μA, indicating that wavelength-stable electroluminescence at 489 nm was achieved. There was negligible wavelength shift as the current was decreased, which is evident from FIG. 20B. At 140 μA, there are two peaks in the red spectral region, one at 597 nm and one at 614 nm. There is also very little shift in the position of these two peaks over the measured current range.

Similar results are obtained for the second device shown in FIG. 21. The main peak at 100 μA is at 487 nm, and there is no shift in the range from 20-100 μA. The strongest peaks in the red spectral region are at 586 nm and 600 nm (at 100 μA). The 600 nm peak shows no shift in the current range from 40-100 μA.

In conventional wurtzite GaN LEDs with the cyan or green emission, a change in current by one order of magnitude can result in peak shifts of 10 nm or more due to a reduced QCSE. Therefore, the observed absence of such peak shifts is a strong indication of EL from the cubic GaN region. Even when the (non-radiative) leakage through other parts of the contact pad is taken into account, this result is valid if it is assumed that the ratio of leakage current to current through the region of interest stays constant. Within the calibration limitations outlined above, the total power of device O8 at 100 μA was determined to be 6 nW with an EQE of $3\times10^{-5}$.

For the purposes of this specification and appended claims, unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth in the following specification and attached claims are approximations that can vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

It is noted that, as used in this specification and the appended claims, the singular forms "a," "an," and "the," include plural referents unless expressly and unequivocally limited to one referent. Thus, for example, reference to "an acid" includes two or more different acids. As used herein, the term "include" and its grammatical variants are intended to be non-limiting, such that recitation of items in a list is not to the exclusion of other like items that can be substituted or added to the listed items.

While particular embodiments have been described, alternatives, modifications, variations, improvements, and substantial equivalents that are or can be presently unforeseen can arise to applicants or others skilled in the art. Accordingly, the appended claims as filed and as they can be amended are intended to embrace all such alternatives, modifications variations, improvements, and substantial equivalents.

What is claimed is:

1. An intermediate semiconductor structure comprising:
a substrate comprising a first material portion and a single crystal silicon layer positioned on the first material portion, the substrate further comprising a major front surface, a major backside surface opposing the major front surface, and a groove positioned in the major front surface, the groove comprising {111} crystal faces and the major front surface comprising a (001) crystal face;
a buffer layer disposed in the groove;
an epitaxially grown semiconductor material disposed over the buffer layer and in the groove, the epitaxially grown semiconductor material comprising a hexagonal crystalline phase layer and a cubic crystalline phase structure disposed over the hexagonal crystalline phase layer, both the hexagonal crystalline phase layer and the cubic crystalline phase structure comprising a Group III-nitride compound semiconductor material, the cubic crystalline phase structure having a length dimension, a width dimension and a height dimension, the width dimension decreasing with at least a portion of the height so that the cubic crystalline phase structure has a tapered portion, the cubic crystalline phase structure having an upper face that is parallel with the (001) crystal face of the major front surface while being disposed over the {111} crystal faces of the groove, and wherein the groove is a truncated v-groove comprising a first diagonal sidewall, a second diagonal sidewall opposing the first diagonal sidewall, and a bottom portion that is parallel with the major front surface of the substrate surface, a gap between the hexagonal crystalline phase layers and the bottom portion of the v-groove, at least a portion of the gap being filled with a gas.

2. The semiconductor structure of claim 1, further comprising an insulating layer formed on the major front surface of the substrate.

3. An intermediate semiconductor structure comprising:
a substrate comprising a first material portion and a single crystal silicon layer positioned on the first material portion, the substrate further comprising a major front surface, a major backside surface opposing the major front surface, and a groove positioned in the major front surface, the groove comprising {111} crystal faces and the major front surface comprising a (001) crystal face;
a buffer layer disposed in the groove;
an epitaxially grown semiconductor material disposed over the buffer layer and in the groove, the epitaxially grown semiconductor material comprising a hexagonal crystalline phase layer and a cubic crystalline phase structure disposed over the hexagonal crystalline phase layer, both the hexagonal crystalline phase layer and the cubic crystalline phase structure comprising a Group III-nitride compound semiconductor material, the cubic crystalline phase structure having a length dimension, a width dimension and a height dimension, the width dimension decreasing with at least a portion of the height so that the cubic crystalline phase structure has a tapered portion, the cubic crystalline phase structure having an upper face that is parallel with the (001) crystal face of the major front surface while being disposed over the {111} crystal faces of the groove, and
wherein the groove is a truncated v-groove comprising a first diagonal sidewall, a second diagonal sidewall opposing the first diagonal sidewall, and a bottom portion that is parallel with the major front surface of the substrate surface, a gap between the hexagonal crystalline phase layers and the bottom portion of the v-groove, at least a portion of the gap being filled with a buffer layer material.

4. The intermediate semiconductor structure of claim 3, wherein the Group III-nitride compound semiconductor material comprises a material selected from gallium nitride (GaN), Indium Gallium Nitride (InGaN) and aluminum gallium nitride (AlGaN).

5. The intermediate semiconductor structure of claim 1, wherein the Group III-nitride compound semiconductor material comprises a material selected from gallium nitride (GaN), Indium Gallium Nitride (InGaN) and aluminum gallium nitride (AlGaN).

6. An intermediate semiconductor structure comprising:
a substrate comprising a first material portion and a single crystal silicon layer positioned on the first material portion, the substrate further comprising a major front surface, a major backside surface opposing the major front surface, and a groove positioned in the major front surface;
a buffer layer disposed in the groove;
an epitaxially grown semiconductor material disposed over the buffer layer and in the groove, the epitaxially grown semiconductor material comprising a cubic crystal of a Group III-nitride compound semiconductor material and wurtzite crystals of the Group III-nitride compound semiconductor material, the wurtzite crystals of the Group III-nitride compound semiconductor material bordering the cubic crystal of the Group III-nitride compound semiconductor material in two border planes that intersect at an angle of about 105° to about 115°.

7. The intermediate semiconductor structure of claim 6, wherein the groove is a v-groove.

8. The intermediate semiconductor structure of claim 6, wherein the groove is a truncated v-groove comprising a first diagonal sidewall, a second diagonal sidewall opposing the first diagonal sidewall, and a bottom portion that is parallel with the major front surface of the substrate surface.

9. The intermediate semiconductor structure of claim 6, wherein the Group III-nitride compound semiconductor material comprises a material selected from gallium nitride (GaN), Indium Gallium Nitride (InGaN) and aluminum gallium nitride (AlGaN).

* * * * *